US006621743B2

(12) United States Patent
Ogane

(10) Patent No.: US 6,621,743 B2
(45) Date of Patent: Sep. 16, 2003

(54) WORD-LINE DRIVING CIRCUIT WITH REDUCED CURRENT LEAKAGE

(75) Inventor: Junichi Ogane, Tokyo (JP)

(73) Assignee: Oki Electric Industry Co., Ltd., Tokyo (JP)

( * ) Notice: Subject to any disclaimer, the term of this patent is extended or adjusted under 35 U.S.C. 154(b) by 0 days.

(21) Appl. No.: 10/106,286

(22) Filed: Mar. 27, 2002

(65) Prior Publication Data

US 2003/0039143 A1 Feb. 27, 2003

(30) Foreign Application Priority Data

Apr. 27, 2001 (JP) ....................................... 2001-131612

(51) Int. Cl.[7] ................................................ G11C 11/34
(52) U.S. Cl. .............................. 365/185.23; 365/185.29
(58) Field of Search ........................ 365/185.23, 185.29

(56) References Cited

U.S. PATENT DOCUMENTS 6,111,792 A 8/2000 Oku et al.
6,490,201 B2 * 12/2002 Sakamoto .............. 365/185.22
6,504,758 B2 * 1/2003 Sacco et al. ........... 365/185.18

FOREIGN PATENT DOCUMENTS

JP 11185489 A 7/1999

* cited by examiner

*Primary Examiner*—M. Tran
(74) *Attorney, Agent, or Firm*—Volentine Francos, PLLC

(57) ABSTRACT

A word-line driving circuit drives the word lines of a non-volatile semiconductor memory to different potentials to read, write, and erase data in memory cells coupled to the word lines. A ground potential is supplied to non-driven word lines through respective switching elements. The data in the memory cells coupled to some or all of the word lines can be erased simultaneously by driving those word lines to an erasing potential. When this is done, a mitigating potential intermediate between the ground potential and the erasing potential is supplied to the switching elements of the driven word lines, thereby reducing current leakage through these switching elements, which are switched off.

17 Claims, 11 Drawing Sheets

VXP
XP
WL
40
45
N40
44
46
42
43
41
nIN
nOUT
LS
IN
OUT
PRE-DEC. A
70
72
71
PRE-DEC. C
XPR
60B
67
67a
67b
$V_{sd}$67
N62
66
66a
66b
N61
N60
62
$V_{sd}$63
61
63
64
64a
64b
65
ROW DEC.
BS
nBS
SEL
XWH
nXWH
BSR
80
83
82
81
WORD-LINE CONTR.
50B
53
52
51
54
nBCER
PRE-DEC. B
24
$AX_0$
$AX_1$
$AX_2$
$AX_3$
$AX_4$
$AX_5$
$AX_6$
$AX_7$
$AX_8$
$AX_9$
PG
ER
BER
CER

VXP
XP
40
45
N40
44
46
42
43
41
nIN
nOUT
LS
IN
OUT
PRE-DEC. A
70A
XPR
73
75
74
PRE-DEC. C
80
XWH
nXWH
83
82
81
WORD-LINE CONTR.
PG
ER
BER
CER
nBCER
50B
51
52
53
54
BSR
BS
nBS
SEL
PRE-DEC. B
60C
68
64a
64b
N61
67
67a
67b
$V_{sd}$67
N62
WL
66
66a
66b
N60
62
61
63
$V_{sd}$63
ROW DEC.
$AX_0$
$AX_1$
$AX_2$
$AX_3$
$AX_4$
$AX_5$
$AX_6$
$AX_7$
$AX_8$
$AX_9$

WORD-LINE DRIVING CIRCUIT WITH REDUCED CURRENT LEAKAGE

BACKGROUND OF THE INVENTION

1. Field of the Invention

The present invention relates to a word-line driving circuit for a non-volatile semiconductor memory.

2. Description of the Related Art

A semiconductor memory includes a plurality of word lines, each coupled to a plurality of memory cells. In normal read and write operations, one of the word lines is selected and driven, and the memory cells coupled to the driven word line are accessed. Some types of non-volatile semiconductor memory, such as flash memory, also perform a chip erase operation, in which all the word lines are driven at once and the data in all the memory cells in the memory device are erased simultaneously.

In a conventional word-line driving circuit for a non-volatile semiconductor memory, each word line is coupled through a first switching element to a signal line that provides various voltages used for reading, writing, and erasing data, and through a second switching element to ground. When the word line is driven, the first switching element is switched on, and the second switching element is switched off. When the word line is not driven, the first switching element is switched off and the second switching element is switched on.

The switching elements are typically metal-oxide-semiconductor field-effect transistors. Even when switched off, these transistors do not block current flow completely; a small subthreshold current leaks through, the amount depending on the source-drain potential difference and the ambient temperature. In a chip erase operation, in which the drain potential of the second switching elements is comparatively high, the total amount of current that leaks through the second switching elements to ground can become large enough to lower the power-supply voltage. Even if the device is designed so that this effect is negligible at normal temperatures, if the chip erase operation is performed under high-temperature conditions, the leakage current may increase to the point where the power-supply voltage is significantly reduced. This reduction of the power-supply voltage in turn reduces the voltages generated from the power-supply voltage, including the voltage used to erase the memory-cell data. A resulting problem is incomplete erasure of the data.

Further explanation of this problem will be given in the detailed description of the invention.

A similar problem can occur in block erase operations, in which the data in the memory cells coupled to a selected group of word lines are erased simultaneously.

SUMMARY OF THE INVENTION

An object of the present invention is to reduce current leakage when the memory cells coupled to a plurality of word lines in a non-volatile semiconductor memory are erased simultaneously.

Another object is to increase the reading speed of a non-volatile semiconductor memory.

The present invention provides both a method of driving the word lines in a non-volatile semiconductor memory, and word-line driving circuits employing the invented method.

The non-volatile semiconductor memory to which the invention pertains has a plurality of memory cells coupled to different word lines. The word lines are selectively driven to different potentials to read, write, and erase data stored in the coupled memory cells. In particular, the data in the memory cells coupled to some or all of the word lines can be erased simultaneously by driving those word lines to an erasing potential.

The word lines are coupled to respective switching elements through which a ground potential is supplied to the word lines that are not driven to one of the above potentials for reading, writing, or erasing. When a plurality of word lines are driven simultaneously to the erasing potential, a mitigating potential is supplied to their respective switching elements, which are switched off. The mitigating potential is intermediate between the ground potential and the erasing potential.

Supply of the mitigating potential, instead of the ground potential, reduces the voltage applied across the switched-off switching elements when a plurality of word lines are driven simultaneously to the erasing potential, thereby reducing current leakage through the switching elements.

The erasing potential may be generated by level-shifting a write control signal. A reading potential may be generated by logic operations, without level shifting, and used to drive the word lines when data are read. The elimination of level-shifting delays can speed up the reading of the data.

DETAILED DESCRIPTION OF THE INVENTION

Figure 1:
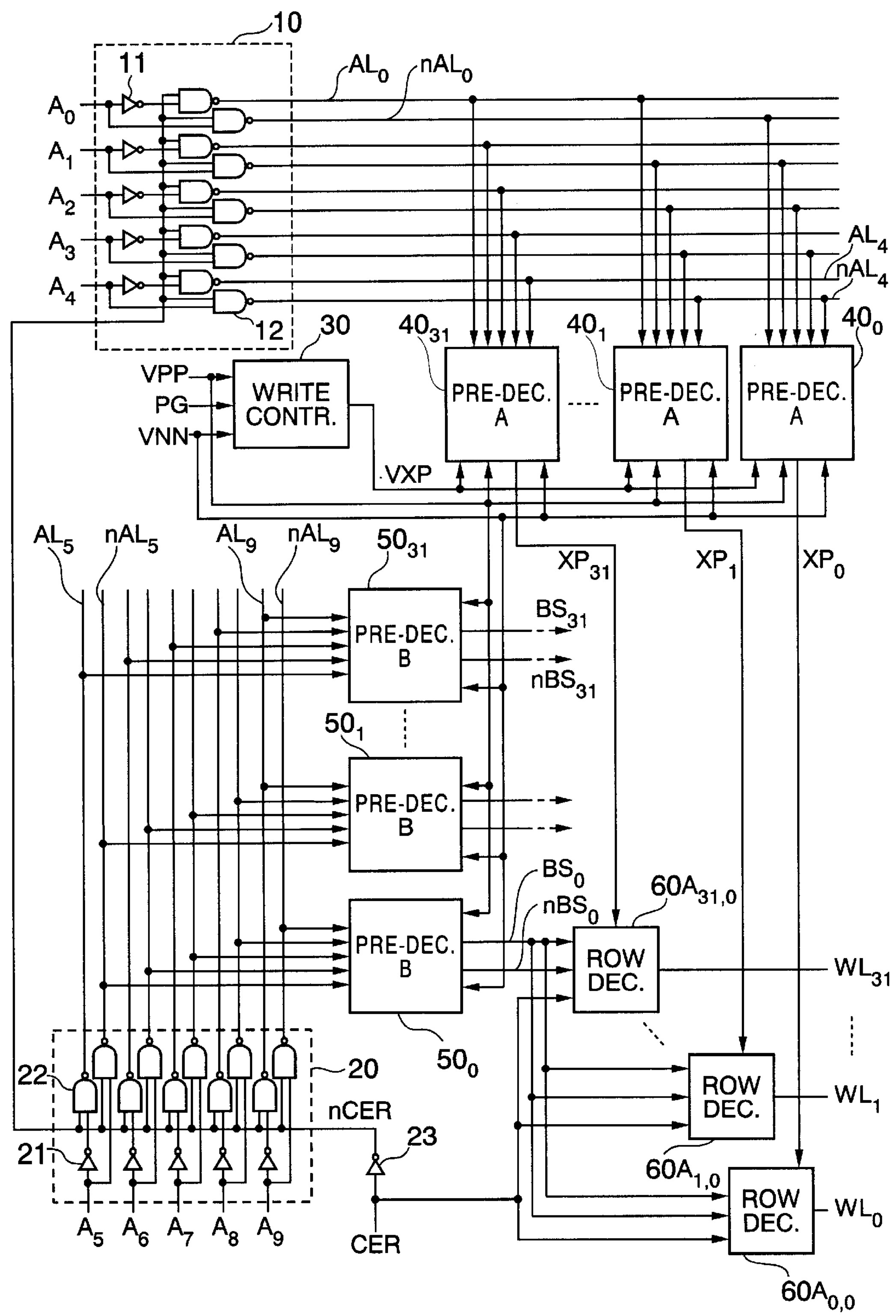
FIG. 1 is a block diagram of a word-line driving circuit according to a first embodiment of the invention.

Embodiments of the invention will now be described with reference to the attached drawings, in which like elements are indicated by like reference characters. The letter 'n' will be used to identify signals and signal lines with negative logic (active low).

Referring to FIG. 1, the first embodiment is a word-line driving circuit comprising a pair of address-line driving circuits 10, 20, an inverter 23, a write controller (WRITE CONTR.) 30, and a plurality of pre-decoders and row decoders. The inverter 23 receives a chip erase signal CER and outputs an inverted chip erase signal nCER.

Address-line driving circuit 10 receives the inverted chip-erase signal nCER and five input address signals $A_0$–$A_4$, and generates complementary pairs of address signals on five pairs of internal address signal lines $AL_0$, $nAL_0$, . . . , $AL_4$, $nAL_4$. These signals are generated by a five inverters 11, which invert the input address signals $A_0$–$A_4$, and ten NAND gates 12. Each NAND gate 12 receives the inverted chip erase signal nCER. Five of the NAND gates receive the inverted address signals output from the inverters 11 and generate non-inverted address signals on internal address signal lines $AL_0$, . . . , $AL_4$. The other five NAND gates receive the non-inverted address signals A0, . . . , A4 and generate inverted address signals on internal address signal lines $nAL_0$, . . . , $nAL_4$. When the inverted chip erase signal nCER is low, all of the address signals output from the address-line driving circuit 10, including both inverted and non-inverted address signals, are high. When nCER is high, the address signals output from the address-line driving circuit 10 go high and low according to the input address signals $A_0$–$A_4$.

Address-line driving circuit 20 has a similar structure, comprising five inverters 21 and ten NAND gates 22, which generate complementary pairs of address signals on internal address signal lines $AL_5$, $nAL_5$, . . . , $AL_9$, $nAL_9$ from input address signals $A_5$–$A_9$ and the inverted chip erase signal nCER, all of these internal address signal lines $AL_5$ to $nAL_9$ going high when nCER is low.

The write controller 30 receives a write (or program) control signal PG and a pair of memory driving potentials VPP and VNN, and generates a control voltage VXP. VXP takes on the VPP or VNN potential, depending on the logic level of the write control signal PG.

The pre-decoders include an A group of pre-decoders (PRE-DEC. A) 40$_i$ (i=1 to 31), each receiving the memory driving potentials VPP, VNN and control voltage VXP, and each coupled to a different combination of five of the ten low-order internal address signal lines $AL_0$ to $nAL_4$. When all five coupled address signal lines are high, A-group pre-decoder 40$_i$ outputs an operating potential signal $XP_i$ having the potential of the control voltage VXP. If any one of the five coupled address signal lines is low, $XP_i$ has the ground potential (0 V).

There is also a B group of pre-decoders (PRE-DEC. B) 50$_j$ (j=0 to 31), each receiving the memory driving potentials VPP, VNN, and each coupled to a different combination of five of the ten high-order internal address signal lines $AL_5$ to $nAL_9$. When all five coupled address signals are high, B-group pre-decoder 50$_j$ activates a complementary pair of selection signals $BS_j$, $nBS_j$. If any one of the five coupled address signal lines is low, $BS_j$, $nBS_j$ are left inactive.

The output signal line of A-group pre-decoder 40$_i$ and the output signal lines of B-group pre-decoder 50$_j$ are connected to a row decoder (ROW DEC.) 60$A_{i,j}$. In all, there are one thousand twenty-four (32×32) row decoders 60$A_{i,j}$, only three of which are shown in FIG. 1. Each row decoder is coupled to and drives a word line $WL_k$ (k=32i+j). The row decoders 60$A_{i,j}$ drive the word lines $WL_k$ to different potentials for read, write, and erase operations, leaving non-driven word lines at the ground level.

In subsequent drawings, subscripts will be omitted when it is not necessary to identify the circuit blocks and signal lines individually. For example, WL will denote an arbitrary word line.

Figure 2:
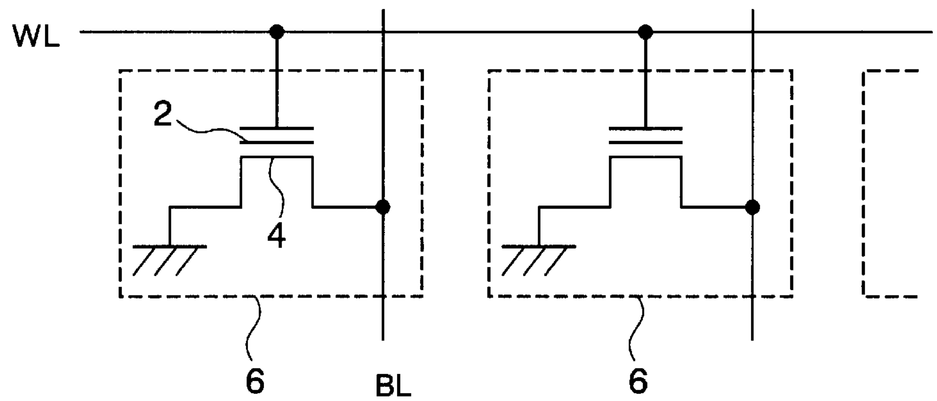
FIG. 2 is a circuit diagram showing a pair of memory cells.

Referring to FIG. 2, the word lines WL are coupled to the control gate electrodes 2 of insulated-gate field-effect transistors (IGFETs) 4 in memory cells 6. The IGFETs also have floating gates 8 in which data are held in the form of stored charge. The source electrode of each IGFET 4 is coupled to ground. The drain electrode the IGFET 4 is coupled to a bit line BL. The word lines WL and bit lines BL are laid out in a row-column matrix, the word lines WL extending in the row direction and the bit lines BL in the column direction, the memory cells 6 being disposed at the intersections of the rows and columns.

The chip erase signal CER, write control signal PG, and address signals in FIG. 1 have normal (non-shifted) logic levels. The high logic level is a power-supply potential such as 3.3 volts (3.3 V), denoted VCC below. The low logic level is the ground potential (0 V), indicated in the drawings by the conventional ground symbol or the letters GND.

Figure 3:
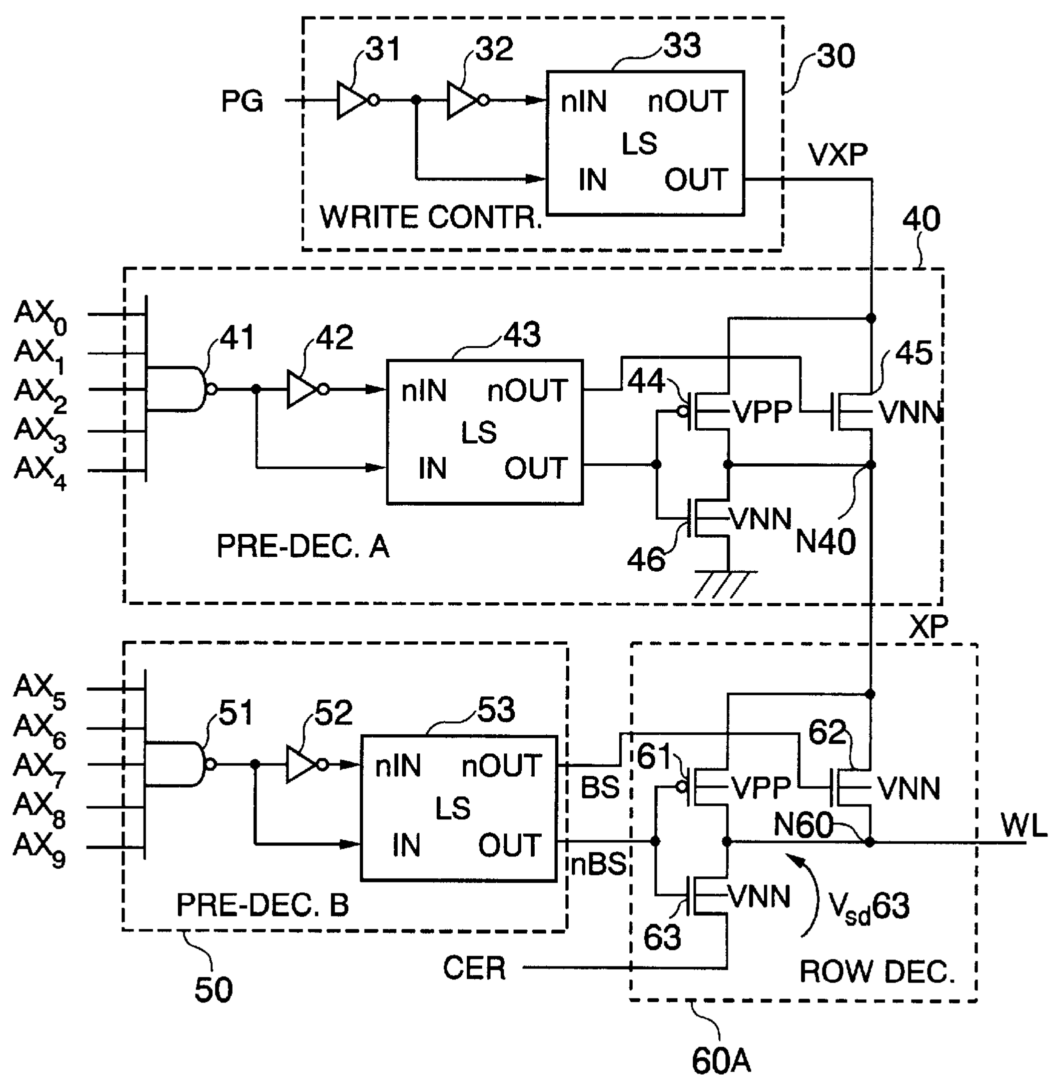
FIG. 3 is a block diagram showing further details of circuit blocks in FIG. 1.

FIG. 3 shows the internal structure of the write controller 30, pre-decoders, and row decoders, showing one row decoder 60A and its connected A-group pre-decoder 40 and B-group pre-decoder 50. All of the row decoders and pre-decoders have the structure shown in this drawing.

The write controller 30 comprises a pair of inverters 31, 32 and a level shifter 33. Inverter 31 inverts the write control signal PG; inverter 32 inverts the output of inverter 31. The level shifter 33 has a non-inverting input terminal IN receiving the output of inverter 31, an inverting input terminal nIN receiving the output of inverter 32, a non-inverting output terminal OUT, and an inverting output terminal nOUT. High and low logic levels of the write control signal PG, received at the input terminals IN and nIN, are level-shifted to the memory driving potentials VPP and VNN for output from the output terminals OUT and nOUT. The control voltage VXP is obtained from output terminal OUT, and is used as a reading potential, writing potential, or erasing potential, depending on the type of operation being performed.

An A-group pre-decoder 40 has a five-input NAND gate 41 that receives five address signals $AX_i$ (i=0 to 4), where $AX_i$ is one of the two complementary address signals on internal address signal lines $AL_i$ and $nAL_i$. The output terminal of NAND gate 41 is coupled to the input terminal of an inverter 42, and to the non-inverting input terminal IN of a level shifter 43. The output terminal of inverter 42 is coupled to the inverting input terminal nIN of the level shifter 43. The non-inverting output terminal of level shifter 43 is coupled to the gate electrodes of a p-channel metal-oxide-semiconductor (PMOS) transistor 44 and an n-channel metal-oxide-semiconductor (NMOS) transistor 46; the inverting output terminal nOUT is coupled to the gate electrode of an NMOS transistor 45.

The source electrodes of PMOS transistor 44 and NMOS transistor 45 are interconnected and both receive the control voltage VXP from the write controller 30. The drain electrodes of PMOS transistor 44 and NMOS transistors 45, 46 are interconnected at a node N40 from which the operating potential signal XP is obtained. The source electrode of NMOS transistor 46 is coupled to ground. PMOS transistor 44 is disposed in a well (not visible) with a well potential of VPP. NMOS transistors 45, 46 are disposed in wells with well potentials of VNN.

B-group pre-decoder 50 has a five-input NAND gate 51 that receives five of the ten address signals $AX_i$ (i=5 to 9), where $AX_i$ is one of the two complementary address signals on internal address signal lines $AL_i$ and $nAL_i$. The output terminal of NAND gate 51 is coupled to the input terminal of an inverter 52, and to the non-inverting input terminal IN of a level shifter 53. The output terminal of inverter 52 is coupled to the inverting input terminal nIN of level shifter 53. Selection signal BS is obtained from the inverting output terminal nOUT of level shifter 53; the complementary selection signal nBS is obtained from the non-inverting output terminal OUT.

Row decoder 60A comprises a PMOS transistor 61 and an NMOS transistor 62, the source electrodes of which are interconnected, both receiving the operating potential signal XP from A-group pre-decoder 40, and an NMOS transistor 63, the source electrode of which receives the chip erase signal CER. Selection signal BS from the B-group pre-decoder 50 is supplied to the gate electrode of NMOS transistor 62. The complementary selection signal nBS is supplied to the gate electrodes of PMOS transistor 61 and NMOS transistor 63. The drain electrodes of PMOS transistor 61 and NMOS transistors 62, 63 are connected at a node N60 to a word line WL. These transistors are also disposed in wells (not visible). The well potential of PMOS transistor 61 is VPP; the well potentials of NMOS transistors 62, 63 are VNN. The source-drain voltage of NMOS transistor 63 is denoted $V_{sd}$63.

Figure 4:
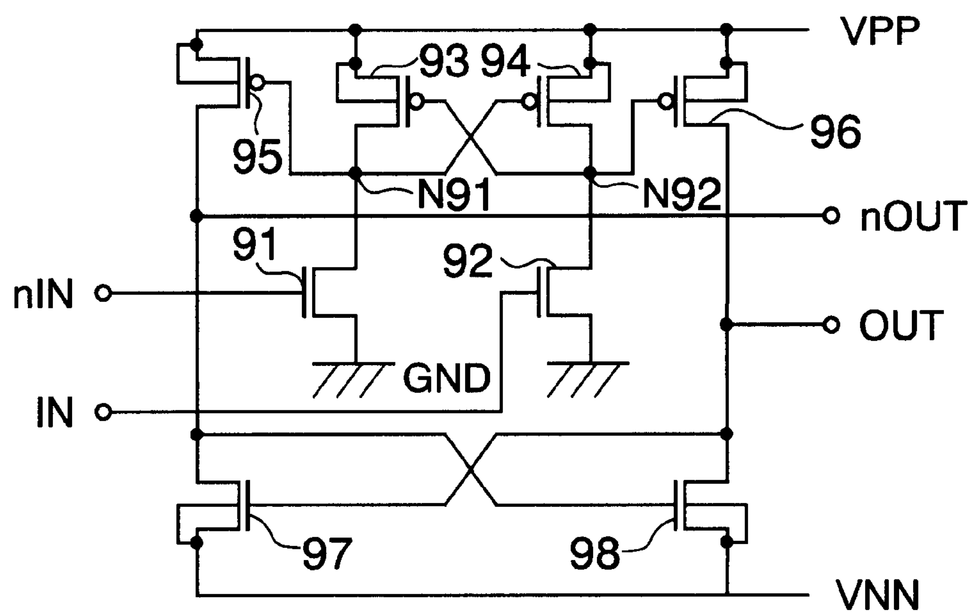
FIG. 4 is a circuit diagram of a level shifter.

FIG. 4 shows the internal structure of the level shifters 33, 43, 53. The inverting input terminal nIN is coupled to the gate electrode of an NMOS transistor 91; the non-inverting input terminal IN is coupled to the gate electrode of an NMOS transistor 92. The source electrodes of both NMOS transistors 91, 92 are coupled to ground; their drain electrodes are coupled to corresponding nodes N91, N92.

Node N91 is coupled to the drain electrode of a PMOS transistor 93, and to the gate electrodes of two more PMOS transistors 94, 95. Node N92 is coupled to the gate electrode of PMOS transistor 93, the drain electrode of PMOS transistor 94, and the gate electrode of a further PMOS transistor 96. The source electrodes of these PMOS transistors 93–96 receive memory driving potential VPP. The drain electrode of PMOS transistor 95 is coupled to the inverting output terminal nOUT, to the drain electrode of an NMOS transistor 97, and to the gate electrode of a further NMOS transistor 98. The drain electrode of PMOS transistor 96 is coupled to the non-inverting output terminal OUT, to the gate electrode of NMOS transistor 97, and to the drain electrode of NMOS transistor 98. The source electrodes of these NMOS transistors 97, 98 receive memory driving potential VNN.

In this circuit configuration, PMOS transistors 93, 94 are cross-coupled so that when one of them is switched on, the other is switched off. NMOS transistors 97, 98 are similarly cross-coupled.

When input terminal IN is at the high logic level and input terminal nIN is at the low logic level, NMOS transistor 91 is switched off and NMOS transistor 92 is switched on. Node N92 is therefore at the ground level, switching on PMOS transistors 93 and 96. Since PMOS transistor 93 is switched on, the potential of node N91 rises, switching off PMOS transistors 94 and 95. Since PMOS transistor 96 is switched on, the gate potential of NMOS transistor 97 rises, switching NMOS transistor 97 on and NMOS transistor 98 off. As a result, the non-inverting output terminal OUT is driven to the VPP level through PMOS transistor 96, and the inverting output terminal nOUT is driven the VNN level through NMOS transistor 97.

Similarly, when input terminal IN is at the low logic level and input terminal nIN is high, NMOS transistor 91 is switched on, NMOS transistor 92 is switched off, PMOS transistors 94 and 95 are switched on, PMOS transistor 93 and 96 are switched off, NMOS transistor 97 is switched off, and NMOS transistor 98 is switched on. The non-inverting output terminal OUT is driven to the VNN level through NMOS transistor 98, and the inverting output terminal nOUT is driven to the VPP level through PMOS transistor 95.

Table 1 summarizes the operation of the circuits in FIG. 3 for four operating modes: read, sector erase, chip erase, and write. Parentheses are used to indicate signals output from pre-decoders and row decoders that are not selected by the address signals $AX_0$–$AX_9$ on the internal address signal lines $AL_0$–$nAL_9$. Parentheses are also used to indicate the source-drain voltage ($V_{sd}$63) of NMOS transistor 63 in a non-selected row decoder, and to indicate a non-driven word line (WL).

TABLE 1

Signal potentials in the first embodiment

| Signal or parameter | Read | Mode: Sector erase | Chip erase | Write |
|---|---|---|---|---|
| VPP | VCC | 12 V | 12 V | 1.6 V |
| VNN | 0 V | 0 V | 0 V | −9 V |
| CER | 0 V | 0 V | VCC | 0 V |
| PG | 0 V | 0 V | 0 V | VCC |
| VXP | = VPP | = VPP | = VPP | = VNN |
| XP | VCC | 12 V | 12 V | −9 V |
| (XP) | 0 V | 0 V | — | 0 V |
| BS | VCC | 12 V | 12 V | 1.6 V |
| nBS | 0 V | 0 V | 0 V | −9 V |
| (BS) | 0 V | 0 V | — | −9 V |
| (nBS) | VCC | 12 V | — | 1.6 V |
| WL | VCC | 12 V | 12 V | −9 V |
| (WL) | 0 V | 0 V | — | 0 V |
| $V_{sd}$63 | VCC | 12 V | 12 V-VCC | −9 V |
| ($V_{sd}$63) | 0 V | 0 V | — | 0 V |

In a read operation, data are read from the memory cells 6 connected to a selected word line, which is driven to a reading potential equal to the power-supply potential VCC (e.g., 3.3 V), while the non-selected word lines are left at the ground potential. This operation takes place as follows.

In the read mode, the VPP potential is equal to the VCC potential, and the VNN potential is equal to the ground potential. The write control signal PG and chip erase signal CER are both low. Since PG is low, the control voltage VXP output from level shifter 33 has the VPP potential (VCC). Address signals $AX_0$ to $AX_4$ select one of the A-group pre-decoders $40_0$ to $40_{31}$ in FIG. 1. In the selected A-group pre-decoder 40 (FIG. 3), PMOS transistor 44 and NMOS transistor 45 are switched on and NMOS transistor 46 is switched off by the output signals of level shifter 43. The operating potential signal XP output from node N40 therefore has the potential of the control voltage VXP, this being the power supply potential VCC, which is the reading potential.

Similarly, address signals $AX_5$ to $AX_9$ select one of the B-group pre-decoders $50_0$ to $50_{31}$ in FIG. 1. The selected B-group pre-decoder 50 (FIG. 3) generates a selection signal BS at the VPP potential (VCC), and a complementary selection signal nBS at the VNN potential (0 V).

The selected A-group pre-decoder 40 and the selected B-group pre-decoder 50 supply the above signals XP, BS, and nBS to a selected row decoder 60A. In this selected row decoder 60A, PMOS transistor 61 and NMOS transistor 62 are switched on and NMOS transistor 63 is switched off by the selection signals from the B-group decoder 50, so the VCC operating potential of signal XP is output from node N60 to the corresponding word line WL, which is thereby driven.

In the non-selected A-group pre-decoders, PMOS transistor 44 and NMOS transistor 45 are switched off and NMOS transistor 46 is switched on, so node N40 and signal XP are at the ground level (0 V). In the non-selected B-group pre-decoders, selection signal BS is at the VNN potential (0 V) and the complementary selection signal nBS is at the VPP potential (VCC). In the non-selected row decoders, accordingly, either PMOS transistor 61 and NMOS transistor 62 are switched off and NMOS transistor 63 is switched on, supplying the low logic level (0 V) of the chip erase signal CER to node N60, or NMOS transistor 63 is switched off and PMOS transistor 61 and NMOS transistor 62 are switched on but the operating potential signal XP supplied to node N60 is at the ground level (0 V). In either case, the connected word line WL is not driven but is left at the ground level.

In a sector erase operation, one word line is selected and driven as described above, and the data stored in the memory cells 6 connected to the selected word line are erased. The write control signal PG and chip erase signal CER are both low. The VPP potential is now equal to an erasing potential of 12 V, while VNN is 0 V. Except for the different VPP potential, the same operations take place as in the read mode. The word line WL connected to the selected row decoder 60A is driven to the 12-V erasing potential of VPP, injecting electrons into the floating gates of the transistors 4 in the connected memory cells 6, erasing the stored data by raising the threshold values of the transistors so that they cannot be turned on. The non-selected word lines remain at ground level, so the data in their connected memory cells 6 are not altered.

In a chip erase operation, all word lines are selected, and the data in all memory cells 6 are erased. The write control signal PG is low, the chip erase signal CER is high, the VPP potential is 12 V, and the VNN potential is 0 V.

Since the chip erase signal CER is high, the inverted chip erase signal nCER is low, and the outputs of all of the NAND gates 12, 22 in the address-line driving circuits 10, 20 are high, selecting all of the A-group pre-decoders 40, B-group pre-decoders 50, and row decoders 60A. In all of the row decoders 60A, PMOS transistor 61 and NMOS transistor 62 are switched on while NMOS transistor 63 is switched off, so all of the word lines WL are driven to the VPP potential (12 V), and the data stored in all of the connected memory cells 6 are simultaneously erased.

Although the drain potential of NMOS transistor 63 in each row decoder 60A is VPP (12 V), the source potential of this transistor is the potential of the chip erase signal CER, which is at the high logic level (VCC), so the source-drain voltage $V_{sd}$63 is VPP−VCC. If VCC is 3.3 V, for example, then $V_{sd}$63 is 8.7 V (=12 V−3.3 V).

In a write operation, data are written into one or more of the memory cells 6 connected to a selected word line. The write control signal PG is high, the chip erase signal CER is low, the VPP potential is 1.6 V, and the VNN potential is −9 V.

Since the write control signal PG is high, the control voltage VXP output from the write controller 30 has the VNN potential of −9 V. Address signals $AX_0$ to $AX_4$ select one of the A-group pre-decoders $\mathbf{40}_0$ to $\mathbf{40}_{31}$ as in the read mode. In the selected A-group pre-decoder 40, PMOS transistor 44 and NMOS transistor 45 are switched on, NMOS transistor 46 is switched off, and the operating potential signal XP output from node N40 has the VNN potential (−9 V) of the control voltage VXP.

Similarly, address signals $AX_5$ to $AX_9$ select one of the B-group pre-decoders $\mathbf{50}_0$ to $\mathbf{50}_{31}$. The selected B-group pre-decoder 50 generates a selection signal BS at the VPP potential (1.6 V), and a complementary selection signal nBS at the VNN potential (−9 V).

The selected A-group pre-decoder 40 and the selected B-group group pre-decoder 50 supply the above signals XP, BS, and nBS to a selected row decoder 60A, in which PMOS transistor 61 and NMOS transistor 62 are switched on and NMOS transistor 63 is switched off. The operating potential signal XP is output from node N60 to the corresponding word line WL, which is thereby driven to the VNN potential (−9 V, the writing potential). This potential permits the connected memory cells 6 to be programmed by data supplied on the bit lines BL (FIG. 2).

In the non-selected A-group pre-decoders, PMOS transistor 44 and NMOS transistor 45 are switched off and NMOS transistor 46 is switched on, so node N40 and the operating potential signal XP are at the ground level (0 V). In the non-selected B-group pre-decoders, selection signal BS is at the VNN potential (−9 V) and the complementary selection signal nBS is at the VPP potential (1.6 V) In the non-selected row decoders, accordingly, either PMOS transistor 61 and NMOS transistor 62 are switched off and NMOS transistor 63 is switched on, so node N60 has the low logic level (0 V) of the chip erase signal CER, or NMOS transistor 63 is switched off and PMOS transistor 61 and NMOS transistor 62 are switched on but the operating potential signal XP supplied to node N60 is at the ground level (0 V). In either case, the connected word line WL is left at the ground level and the data in the memory cells 6 connected thereto are not altered.

In the first embodiment, the source electrode of NMOS transistor 63 is not tied to the ground level, but varies with the chip erase signal CER. During a chip erase operation, when the drain potential of NMOS transistor 63 is 12 V, its source potential is raised to the power supply potential VCC, so its source-drain voltage $V_{sd}$63 is reduced from 12 V to, for example, 8.7 V (if VCC is 3.3 V). This reduction reduces the leakage of current through NMOS transistor 63 to an acceptable level, even if the chip-erase operation is carried out under high-temperature conditions. The data in all memory cells 6 can therefore be adequately erased, despite a high ambient temperature.

Figure 5:
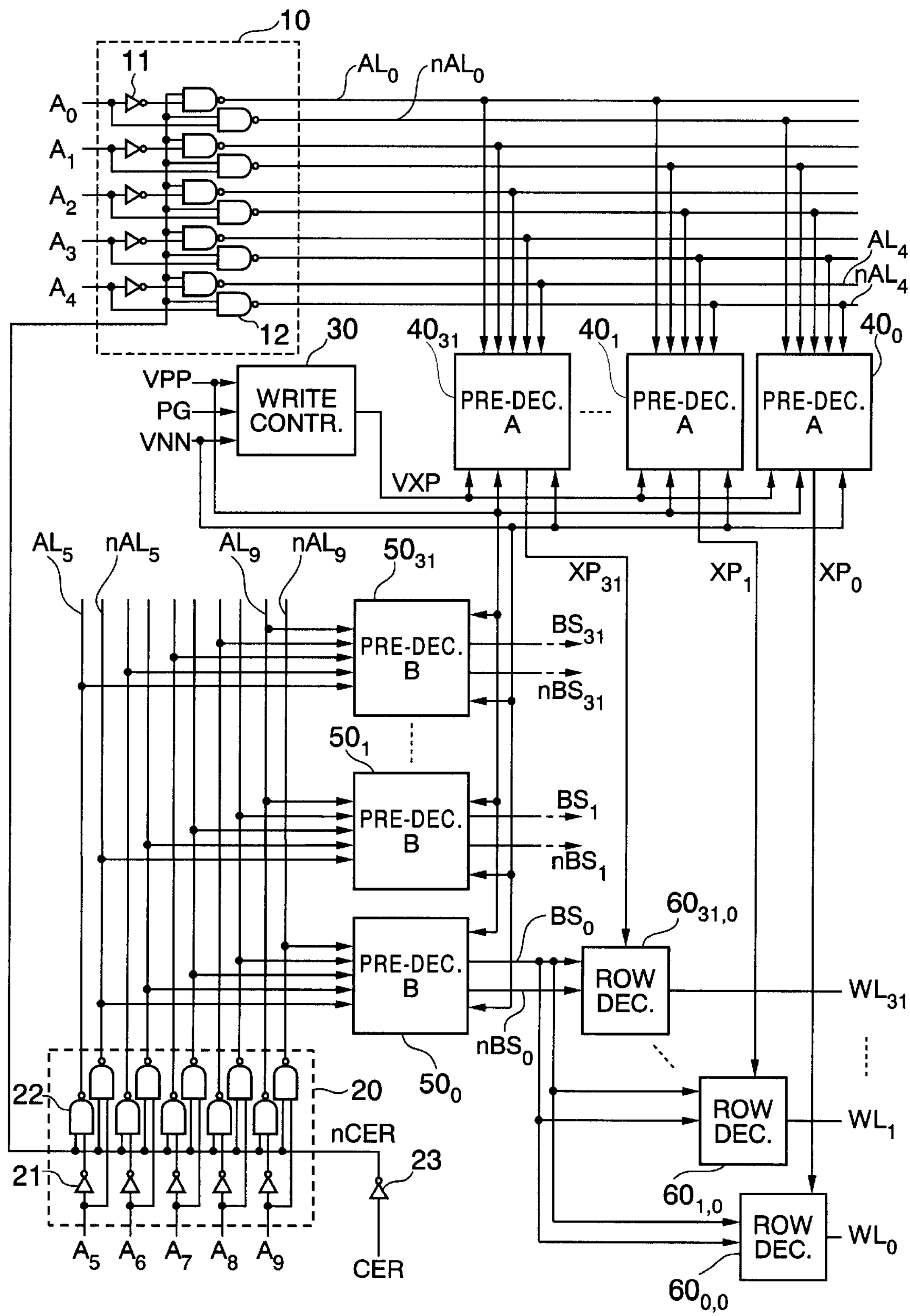
FIG. 5 is a block diagram of a conventional word-line driving circuit.
Figure 6:
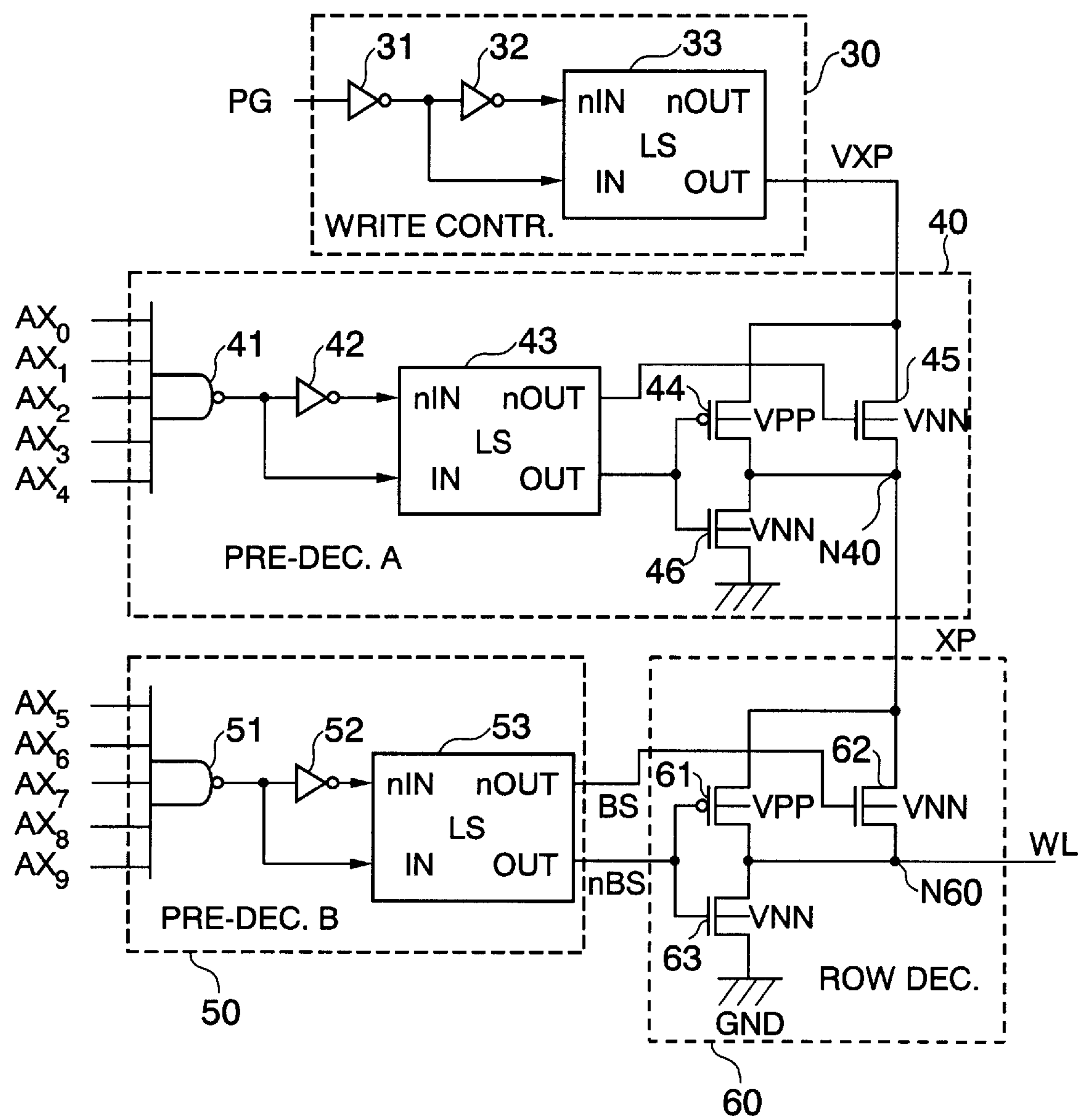
FIG. 6 is a block diagram showing further details of circuit blocks in FIG. 5.

For comparison, FIG. 5 shows a conventional word-line driving circuit having the same circuit blocks as in the first embodiment but not supplying the chip erase signal CER to the row decoders $\mathbf{60}_{0,0}$, $\mathbf{60}_{1,0}$, . . . FIG. 6 shows the internal structure of a representative row decoder 60, together with the internal structure of the connected pre-decoders 40, 50 and the write controller 30. Taken individually, these circuit blocks are similar to the corresponding circuit blocks in the first embodiment. The difference is that in the conventional row decoder 60, the source electrode of NMOS transistor 63 is coupled to ground instead of receiving the chip erase signal CER.

Table 2 summarizes the operation of the conventional word-line driving circuit shown in FIGS. 5 and 6. Except for the source-drain voltage $V_{sd}$63 of NMOS transistor 63 in the chip erase mode, all potentials are the same as in Table 1.

TABLE 2

Conventional signal potentials

| Signal | Mode | | | |
|---|---|---|---|---|
| | Read | Sector erase | Chip erase | Write |
| VPP | VCC | 12 V | 12 V | 1.6 V |
| VNN | 0 V | 0 V | 0 V | −9 V |
| CER | 0 V | 0 V | VCC | 0 V |
| PG | 0 V | 0 V | 0 V | VCC |
| VXP | = VPP | = VPP | = VPP | = VNN |
| XP | VCC | 12 V | 12 V | −9 V |
| (XP) | 0 V | 0 V | — | 0 V |
| BS | VCC | 12 V | 12 V | 1.6 V |
| nBS | 0 V | 0 V | 0 V | −9 V |
| (BS) | 0 V | 0 V | — | −9 V |
| (nBS) | VCC | 12 V | — | 1.6 V |
| WL | VCC | 12 V | 12 V | −9 V |
| (WL) | 0 V | 0 V | — | 0 V |
| $V_{sd}$63 | VCC | 12 V | 12 V | −9 V |
| ($V_{sd}$63) | 0 V | 0 V | — | 0 V |

In a chip erase operation, a source-drain voltage $V_{sd}$63 of 12 V is applied across the NMOS transistors 63 in all row decoders. If the gate width of NMOS transistor 63 is thirty micrometers (30 μm), for example, since there are one thousand twenty-four word lines, the total gate width of the NMOS transistors 63 adds up to substantially thirty millimeters (30 mm). Under 125° C. temperature conditions, for example, the subthreshold leakage current is on the order of five nanoamperes per micrometer of gate width ($5\times10^{-9}$ A/μm) so the total leakage current is substantially one hundred fifty microamperes (150 μA). If the nominal power supply potential VCC is 3.3 V, this amount of leakage can lower VCC to such an extent that the voltage boosting circuits (not shown) that generate VPP from VCC are unable to generate the 12-V potential required to ensure complete erasing of the data in the memory cells 6.

Next, a second embodiment will be described. The word-line driving circuit in the second embodiment is used in a non-volatile semiconductor memory that is divided into blocks, each block including word lines in a different address range. In addition to the chip erase operation described in the first embodiment, the second embodiment provides a block erase operation, in which the memory cells connected to the word lines in a selected block are erased simultaneously. A block erase operation is faster than a chip erase operation, and extends the life of the non-volatile semiconductor memory by avoiding unnecessary erasing of the entire memory.

Figure 7:
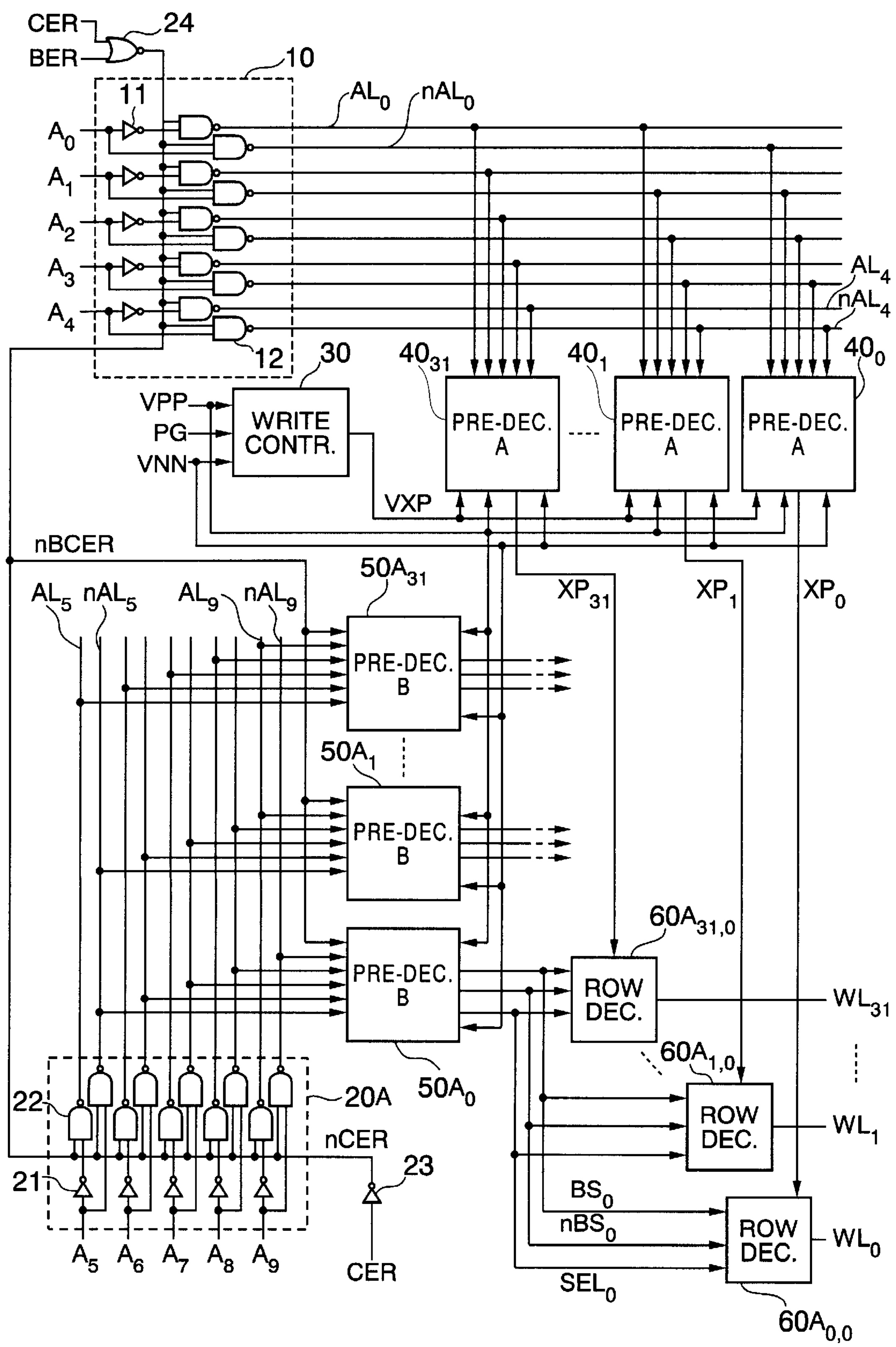
FIG. 7 is a block diagram of a word-line driving circuit according to a second embodiment of the invention.

FIG. 7 shows the word-line driving circuit in the second embodiment. The address-line driving circuits 10, 20, inverter 23, write controller 30, and A-group pre-decoders $\mathbf{40}_0$–$\mathbf{40}_{31}$ are identical to the corresponding elements in the first embodiment, but an additional NOR gate 24 is provided. The inputs to NOR gate 24 are the chip erase signal CER and a block erase signal BER. The output of NOR gate 24 is a combined erase signal, more specifically an inverted block/chip erase signal nBCER that is supplied in place of the inverted chip erase signal nCER to all NAND gates 12 in the address-line driving circuit 10, and to the first four NAND gates 22 in address-line driving circuit 20. The other six NAND gates 22 in the address-line driving circuit 20 receive nCER as in the first embodiment.

In a block erase operation, the block erase signal BER goes high, so the inverted block/chip erase signal nBCER goes low. The internal address signal lines from $AL_0$, $nAL_0$ to $AL_6$, $nAL_6$ are thereby all forced to the high logic level. The internal address signal lines from $AL_7$, $nAL_7$ to $AL_9$, $nAL_9$ go high or low according to address input signals $A_7$, $A_8$, $A_9$.

In a chip erase operation, the chip erase signal CER goes high, so the inverted block/chip erase signal nBCER again goes low, as does the inverted chip erase signal nCER. All of the internal address signal lines from $AL_0$ to $nAL_9$ are thereby forced to the high logic level.

The inverted block/chip erase signal nBCER is also supplied to the B-group pre-decoders $\mathbf{50A}_0$ to $\mathbf{50A}_{31}$, which differ in structure from the B-group pre-decoders in the first embodiment. In addition to the BS and nBS selection signals described in the first embodiment, the B-group pre-decoders generate selection signals $SEL_0$, $SEL_1$, . . . The row decoders $\mathbf{60A}_{0,0}$, $\mathbf{60A}_{1,0}$, . . . receive these selection signals in place of the chip erase signal CER.

Figure 8:
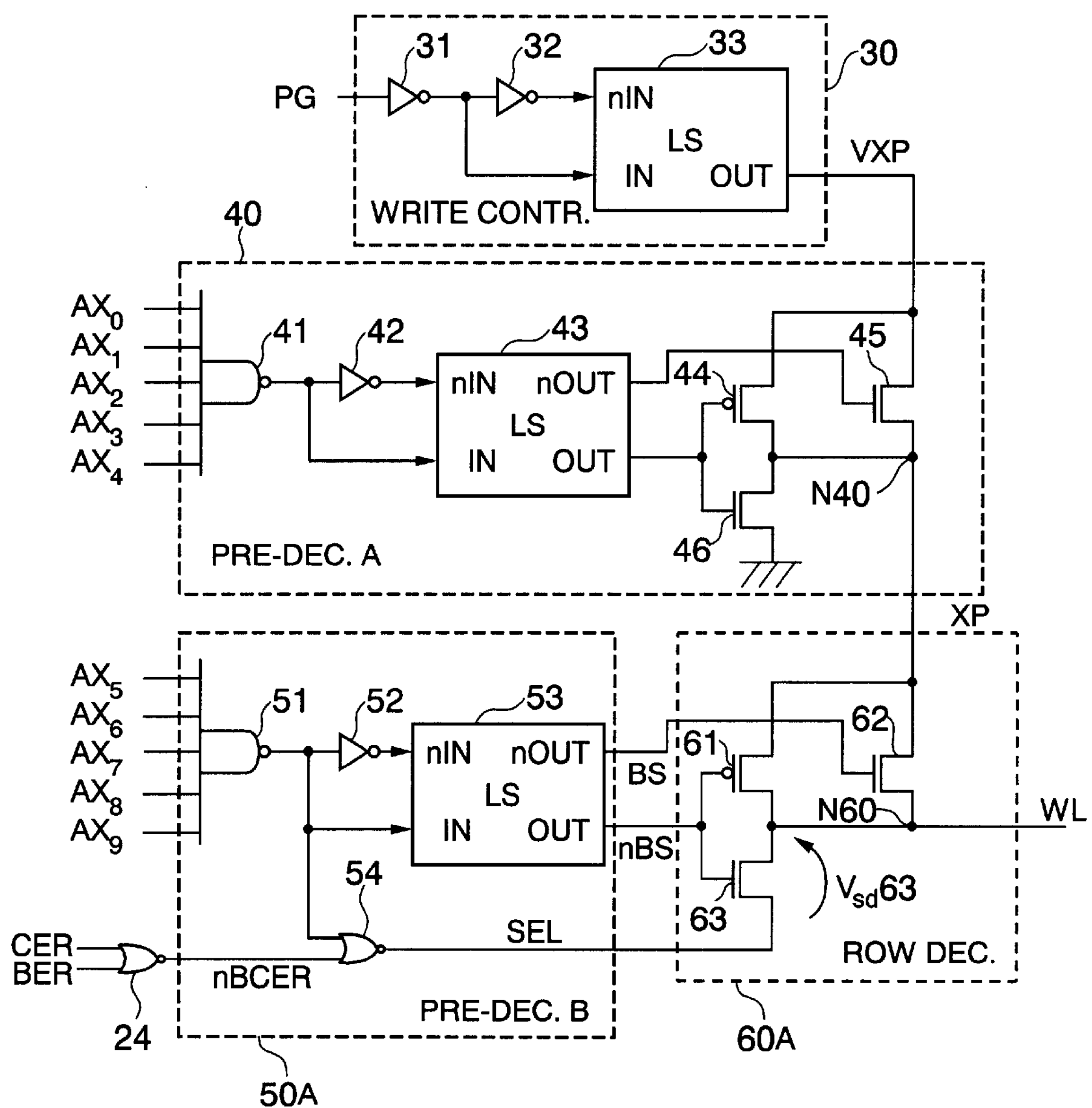
FIG. 8 is a block diagram showing further details of circuit blocks in FIG. 7.

FIG. 8 shows the internal structure of a representative row decoder 60A and its connected A-group pre-decoder 40 and B-group pre-decoder 50A in the second embodiment. In addition to the NAND gate 51, inverter 52, and level shifter 53 of the first embodiment, the B-group pre-decoder 50A of the second embodiment includes a NOR gate 54 that receives the output of NAND gate 51 and the inverted block/chip erase signal nBCER from NOR gate 24. The output of NOR gate 54 is the selection signal SEL that is supplied to the connected row decoder 60A.

The selection signal SEL is supplied to the source electrode of NMOS transistor 63 in the row decoder 60A. In other respects, row decoder 60A is identical to the row decoder 60A in the first embodiment. The write controller 30 and A-group pre-decoder 40 are also identical to the corresponding elements in the first embodiment.

The operation of the second embodiment is summarized in Table 3.

TABLE 3

Signal potentials in the second embodiment

| Signal or parameter | Mode | | | | |
|---|---|---|---|---|---|
| | Read | Sector erase | Block erase | Chip erase | Write |
| VPP | VCC | 12 V | 12 V | 12 V | 1.6 V |
| VNN | 0 V | 0 V | 0 V | 0 V | −9 V |
| PG | 0 V | 0 V | 0 V | 0 V | VCC |
| BER | 0 V | 0 V | VCC | 0 V | 0 V |
| CER | 0 V | 0 V | 0 V | VCC | 0 V |
| VXP | = VPP | = VPP | = VPP | = VPP | = VNN |
| XP | VCC | 12 V | 12 V | 12 V | −9 V |
| (XP) | 0 V | 0 V | — | — | 0 V |
| BS | VCC | 12 V | 12 V | 12 V | 1.6 V |
| nBS | 0 V | 0 V | 0 V | 0 V | −9 V |
| SEL | 0 V | 0 V | VCC | VCC | 0 V |
| (BS) | 0 V | 0 V | 0 V | — | −9 V |
| (nBS) | VCC | 12 V | 12 V | — | 1.6 V |
| (SEL) | 0 V | 0 V | 0 V | 0 V | 0 V |
| WL | VCC | 12 V | 12 V | 12 V | −9 V |
| (WL) | 0 V | 0 V | 0 V | — | 0 V |
| $V_{sd}$63 | VCC | 12 V | 12 V-VCC | 12 V-VCC | 9 V |
| ($V_{sd}$63) | 0 V | 0 V | 0 V | — | 0 V |

In the read, sector erase, and write modes, the block erase signal BER and chip erase signal CER are both low, so the inverted block/chip erase signal nBCER is high, and all the selection signals SEL output from the NOR gates 54 in the B-group pre-decoders 50A are low. The source electrodes of NMOS transistors 63 in the row decoders 60A are therefore all at the ground potential (0 V). Read, sector erase, and write operations proceed as described in the first embodiment.

In a chip erase operation, since all internal address signal lines $AL_0$ to $nAL_9$ are at the high logic level, all A-group and B-group pre-decoders are selected, and all row decoders 60A are selected. Since the inverted block/chip erase signal nBCER is low, and since the outputs of NAND gate 51 are low in all B-group pre-decoders 50A, the selection signals SEL output from the NOR gates 54 in all the B-group pre-decoders 50A are high. The source electrodes of NMOS transistors 63 in the row decoders 60A are therefore all at the power-supply potential (VCC). Chip erase operations proceed as in the first embodiment, the reduced source-drain voltage $V_{sd}$63 of the NMOS transistors 63 mitigating the problem of excessive subthreshold current leakage at high temperatures.

In a block erase operation, the block erase signal BER is high, the chip erase signal CER is low, and the inverted block/chip erase signal nBCER is low. All of the A-group pre-decoders are selected, and each generates an operating potential signal XP with the VPP potential.

Since internal address lines $AL_5$ to $nAL_6$ are high regardless of the values of the corresponding input address signals $A_5$, $A_6$, four of the thirty-two B-group pre-decoders 50A are selected according to the remaining high-order address signals $A_7$, $A_8$, $A_9$. In these four selected B-group pre-decoders 50A, the output of NAND gate 51 goes low, and since the inverted block/chip erase signal nBCER is also low, the selection signal SEL output from NOR gate 54 goes high (to the VCC potential). In the non-selected B-group pre-decoders 50A, the output of NAND gate 51 is high, so the selection signal SEL is low (0 V).

All of the row decoders 60A connected to the four selected B-group pre-decoders 50A are selected; the other row decoders remain non-selected. In the selected row decoders 60A, PMOS transistor 61*d* and NMOS transistor 62 are switched on and NMOS transistor 63 is switched off, so the connected word lines WL are driven to the VPP operating potential of the XP signal. In addition, the source potential of NMOS transistor 63 is the VCC potential of the selection signal SEL, while the drain potential of this transistor is the VPP potential of signal XP, so the source-drain voltage $V_{sd}$63 is VPP−VCC. For example, if VCC is 3.3 V and VPP is 12 V, then $V_{sd}$63 is 8.7 V.

In the non-selected row decoders 60A (the row decoders connected to non-selected B-group pre-decoders 50A), since the selection signal SEL is low, the source electrode of NMOS transistor 63 is at the ground level (0 V). In addition, PMOS transistor 61*d* and NMOS transistor 62 are switched off and NMOS transistor 63 is switched on, so the connected word lines WL are held at the ground level and is not driven.

A block erase operation erases all the memory cells 6 connected to a block of one hundred twenty-eight (4×32) word lines selected by four group-B decoders. The reduced source-drain voltage of NMOS transistors 63 in the row decoders 60A of these word lines enables the block erase operation to be carried out without significant effect on the power-supply potential VCC, even under high-temperature conditions.

The second embodiment thus extends the effect of the first embodiment to include both chip erase and block erase operations.

Figure 9:
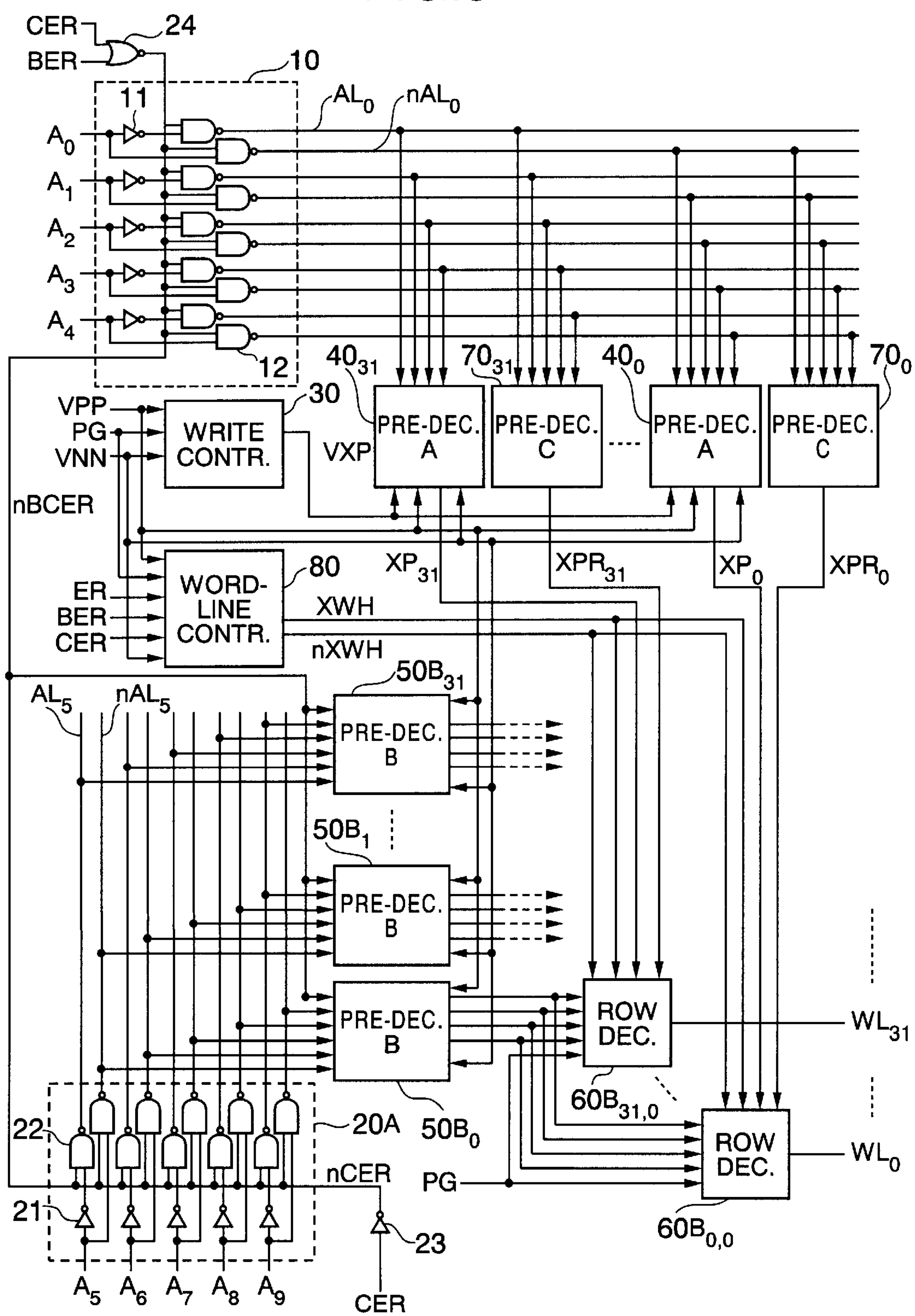
FIG. 9 is a block diagram of a word-line driving circuit according to a third embodiment of the invention.

Referring to FIG. 9, the third embodiment of the invention replaces the B-group pre-decoders and row decoders of the second embodiment with B-group pre-decoders 50$B_0$ to 50$B_{31}$ and row decoders 60$B_{0,0}$, 60$B_{1,0}$ . . . having a different internal structure, and adds C-group pre-decoders 70$_0$ to 70$_{31}$ and a word-line controller (CONTR.) 80. The C-group pre-decoders 70$_0$ to 70$_{31}$ are coupled to the same internal address signal lines $AL_0$, $nAL_0$ to $AL_{31}$, $nAL_{31}$ as the corresponding A-group pre-decoders 40$_0$ to 40$_{31}$. Each row decoder 60B is coupled to one A-group pre-decoder 40, one B-group pre-decoder 50B, one C-group pre-decoder 70, and the word-line controller 80.

Figure 10:
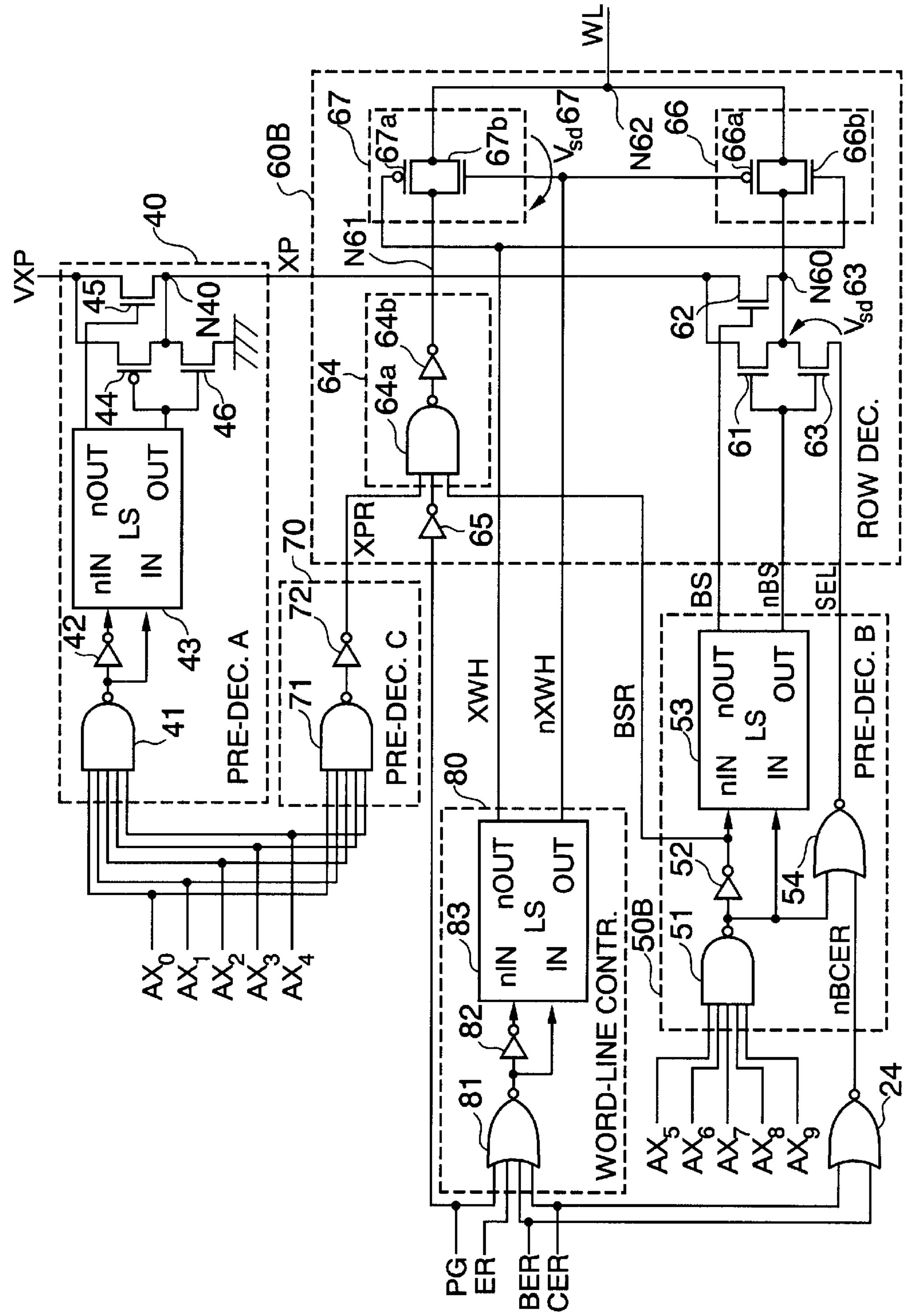
FIG. 10 is a block diagram showing further details of circuit blocks in FIG. 9.

FIG. 10 shows the internal structure of a typical row decoder 60B in the third embodiment, together with the internal structure of its connected pre-decoders 40, 50B, 70, and the word-line controller 80.

The A-group pre-decoder 40 has the same structure as in the first and second embodiments.

The C-group pre-decoder 70 comprises a five-input NAND gate 71 and an inverter 72. The NAND gate 71 receives the same internal address signals $AX_0$–$AX_4$ as the NAND gate 41 in the A-group pre-decoder 40. Inverter 72 inverts the output of NAND gate 71 to generate a reading potential signal XPR, which is supplied to the row decoder 60B. Taken together, the NAND gate 71 and inverter 72 constitute an AND gate.

The B-group pre-decoder 50B comprises the same NAND gate 51, inverter 52, level shifter 53, and NOR gate 54 as in the second embodiment. The difference between the B-group pre-decoders in the second and third embodiments is that in the third embodiment, the output signal of inverter 52 is supplied as a read selection signal BSR to the row decoder 60B, together with the complementary selection signals BS, nBS output from the level shifter 53 and the selection signal SEL output from NOR gate 54.

The word-line controller 80 has a four-input NOR gate 81 that receives the write control signal PG, a sector erase signal ER, the block erase signal BER, and the chip erase signal CER. The output of NOR gate 81 is supplied to an inverter 82 and to the non-inverting input terminal IN of a level shifter 83 having the internal structure shown in FIG. 4. The output of inverter 82 is supplied to the inverting input terminal nIN of level shifter 83. The level shifter 83 generates an operating mode signal XWH from its inverting output terminal nOUT and a complementary operating mode signal nXWH from its non-inverting output terminal OUT. These operating mode signals XWH, nXWH are supplied to the row decoder 60B.

The row decoder 60B has two output means. The first output means comprises a PMOS transistor 61 and NMOS transistors 62, 63 as described in the second embodiment, the gate electrodes of PMOS transistor 61 and NMOS transistor 63 receiving the nBS signal, the gate electrode of NMOS transistor 62 receiving the selection signal BS, the source electrodes of PMOS transistor 61 and NMOS transistor 62 receiving operating potential signal XP from node N40 in the A-group pre-decoder 40, the source electrode of NMOS transistor 63 receiving selection signal SEL, and the drain electrodes of these transistors 61, 62, 63 being interconnected at a node N60. The second output means comprises an AND gate 64 and an inverter 65. In addition, row decoder 60B has a pair of transmission gates 66, 67.

Inverter 65 inverts the write control signal PG. The AND gate 64 comprises a NAND gate 64*a* that receives the inverted write control signal PG from inverter 65, the read selection signal BSR from the B-group decoder 50B, and the reading potential signal XPR from the C-group pre-decoder 70, and an inverter 64*b* that inverts the output of NAND gate 64*a* and supplies the inverted signal to a node N61.

Transmission gate 66 comprises a PMOS transistor 66*a* and an NMOS transistor 66*b* coupled in parallel between node N60 and a node N62 to which the word line WL is connected. Transmission gate 67 comprises a PMOS transistor 67*a* and an NMOS transistor 67*b* coupled in parallel between node N61 and node N62. PMOS transistors 66*a*, 67*a* are disposed in wells (not visible) with a well potential of VPP. NMOS transistors 66*b*, 67*b* are disposed in wells (not visible) with a well potential of VNN. The gate electrodes of NMOS transistor 66*b* and PMOS transistor 67*a* receive the operating mode signal XWH from the word-line controller 80. The gate electrodes of PMOS transistor 66*a* and NMOS transistor 67*b* receive the complementary mode signal nXWH. These two transmission gates 66, 67 connect the word line WL to node N60 when XWH is high and nXWH is low, and to node N61 when XWH is low and nXWH is high.

The operation of the third embodiment is summarized in Table 4.

TABLE 4

Signal potentials in the third embodiment

| Signal or parameter | Mode | | | | |
|---|---|---|---|---|---|
| | Read | Sector erase | Block erase | Chip erase | Write |
| VPP | VCC | 12 V | 12 V | 12 V | 1.6 V |
| VNN | 0 V | 0 V | 0 V | 0 V | –9 V |
| PG | 0 V | 0 V | 0 V | 0 V | VCC |
| ER | 0 V | VCC | 0 V | 0 V | 0 V |
| BER | 0 V | 0 V | VCC | 0 V | 0 V |
| CER | 0 V | 0 V | 0 V | VCC | 0 V |
| nBCER | VCC | VCC | 0 V | 0 V | VCC |
| VXP | = VPP | = VPP | = VPP | = VPP | = VNN |
| XP | VCC | 12 V | 12 V | 12 V | –9 V |
| (XP) | 0 V | 0 V | — | — | 0 V |
| XPR | VCC | VCC | VCC | VCC | VCC |
| (XPR) | 0 V | 0 V | — | — | 0 V |
| BS | VCC | 12 V | 12 V | 12 V | 1.6 V |
| nBS | 0 V | 0 V | 0 V | 0 V | –9 V |
| SEL | 0 V | 0 V | VCC | VCC | 0 V |
| BSR | VCC | VCC | VCC | VCC | VCC |
| (BS) | 0 V | 0 V | 0 V | — | –9 V |
| (nBS) | VCC | 12 V | 12 V | — | 1.6 V |
| (SEL) | 0 V | 0 V | 0 V | 0 V | 0 V |
| (BSR) | 0 V | 0 V | 0 V | 0 V | 0 V |
| WL | VCC | 12 V | 12 V | 12 V | –9 V |
| (WL) | 0 V | 0 V | 0 V | — | 0 V |
| $V_{sd}63$ | VCC | 12 V | 12 V-VCC | 12 V-VCC | –9 V |
| $V_{sd}67$ | 0 V | 12 V-VCC | 12 V-VCC | 12 V-VCC | –9 V |
| ($V_{sd}63$) | 0 V | 0 V | 0 V | — | 0 V |
| ($V_{sd}67$) | 0 V | 0 V | 0 V | — | 0 V |

In a read operation, the write control signal PG, sector erase signal ER, block erase control signal BER, and chip erase signal CER are all low, VPP is the power-supply potential VCC (3.3 V, for example), VNN is the ground potential (0 V), and VXP is equal to VPP (VCC).

In the word-line controller 80, the output of NOR gate 81 is high and the output of inverter 82 is low, so the operating mode signal XWH has the VNN potential (0 V), and the complementary operating mode signal nXWH has the VPP potential (VCC). In each row decoder 60B, accordingly, transmission gate 66 is switched off and transmission gate 67 is switched on, connecting word line WL to the second output means at node N61.

The low-order address signals $AX_0$–$AX_4$ select one of the C-group pre-decoders $\mathbf{70}_0$–$\mathbf{70}_{31}$. The reading potential signal XPR output from the selected C-group pre-decoder 70 goes high, while the XPR signals output from the non-selected C-group pre-decoders 70 remain low.

Similarly, the high-order address signals $AX_5$–$AX_9$ select one of the B-group pre-decoders $\mathbf{50}B_0$–$\mathbf{50}B_{31}$. The BSR output signal of the selected B-group pre-decoder 50B goes high, while the BSR output signals of the non-selected B-group pre-decoders 50B remain low.

In the row decoder 60B selected by the address signals $AX_0$–$AX_9$, the XPR and BSR signals received by the AND gate 64 are both high, as is the inverted write control signal PG generated by inverter 65, so the AND gate 64 drives node N61 to the high logic level (VCC), thus to the same level as the reading potential signal XPR. In the non-selected row decoders, either XPR or BSR, or both, is low, so node N61 is held at the low (ground) level. In all of the row decoders 60B, the logic level at node N61 is output as a reading potential through transmission gate 67 to node N62. The word line WL connected to the selected row decoder 60B is thereby driven to the VCC level, while the other word lines remain at the ground level.

In a sector erase operation, the write control signal PG is low, the sector erase signal ER is high, and the block erase signal BER and the chip erase signal CER are low. The VPP potential is 12 V and the VNN potential is 0 V.

In the word-line controller 80, the output of NOR gate 81 is low and the output of inverter 82 is high, so the potential of the operating mode signal XWH is VPP (12 V), and the potential of the complementary operating mode signal nXWH is VNN (0 V). In each row decoder 60B, accordingly, transmission gate 66 is switched on and transmission gate 67 is switched off, connecting word line WL to the first output means at node N60.

The low-order address signals $AX_0$–$AX_4$ select one of the A-group pre-decoders $\mathbf{40}_0$–$\mathbf{40}_{31}$. The operating potential signal XP output from the selected A-group pre-decoder 40 goes to the VPP level, while the XP signals output from the non-selected A-group pre-decoders remain at the VNN level.

Similarly, the high-order address signals $AX_5$–$AX_9$ select one of the B-group pre-decoders $\mathbf{50}B_0$–$\mathbf{50}B_{31}$. In the selected B-group pre-decoder 50B, selection signal BS is at the VPP potential and the complementary selection signal nBS is at the VNN potential. In the non-selected B-group pre-decoders, selection signal BS is at the VNN potential and the complementary selection signal nBS is at the VPP potential. In all B-group pre-decoders, since the nBCER signal is high, selection signal SEL is low.

In the row decoder 60B selected by the address signals $AX_0$–$AX_9$, selection signals BS and nBS turn on PMOS transistor 61 and NMOS transistor 62, so node N60 is raised to the VPP operating potential (12 V) of the XP signal from the selected the A-group decoder 40, and this VPP potential is transmitted through transmission gate 66 to the word line WL. In the non-selected row decoders, node N60 is held at the VNN level, either by the XP signal from a non-selected A-group pre-decoder or by the SEL selection signal from a non-selected B-group pre-decoder, so the connected word line WL remains at the VNN level (0 V).

In a block erase operation, the write control signal PG and sector erase signal ER are low, the block erase signal BER is high, and the chip erase signal CER is low. VPP is 12 V and VNN is 0 V.

In the word-line controller 80, the output of NOR gate 81 is low, so as in the sector erase mode, transmission gate 66 is switched on and transmission gate 67 is switched off in each row decoder 60B, connecting word line WL to node N60.

The low-order address signals $AX_0$–$AX_4$ select all of the A-group pre-decoders $\mathbf{40}_0$–$\mathbf{40}_{31}$. The operating potential signals XP output from all the A-group pre-decoders are at the VPP level.

As in the second embodiment, the address signals $AX_7$–$AX_9$ select four of the B-group pre-decoders 50$B_0$–50$B_{31}$. In the selected B-group pre-decoders 50B, selection signal BS is at the VPP potential, the complementary selection signal nBS is at the VNN potential, and selection signal SEL is at the high logic level (VCC). In the non-selected B-group pre-decoders, selection signal BS is at the VNN potential, the complementary selection signal nBS is at the VPP potential, and selection signal SEL is low.

In the row decoders 60B coupled to the selected B-group pre-decoders 50B, selection signals BS and nBS turn on PMOS transistor 61 and NMOS transistor 62, raising node N60 to the VPP potential (12 V) of the XP signal, and this VPP potential (12 V) is transmitted through transmission gate 66 to the word line WL. Since selection signal SEL is high (VCC), the source-drain voltage $V_{sd}$63 of NMOS transistor 63 is VPP−VCC.

In the row decoders non-selected coupled to non-selected B-group pre-decoders 50B, node N60 is held at the ground level of selection signal SEL, so the connected word line WL remains at the VNN level (ground).

In a chip erase operation, the write control signal PG, sector erase signal ER, and block erase signal BER are low, while the chip erase signal CER is high. VPP is 12 V and VNN is 0 V.

In the word-line controller 80, the output of NOR gate 81 is low, so transmission gate 66 is switched on and transmission gate 67 is switched off in each row decoder 60B, connecting word line WL to node N60.

The address signals $AX_0$–$AX_9$ select all of the A-group pre-decoders 40$_0$–40$_{31}$ and B-group pre-decoders 50$B_0$–50$B_{31}$. Signals XP and BS are at the VPP potential, nBS is at the VNN potential, and SEL is at the high logic level (VCC).

In all row decoders 60B, selection signals BS and nBS turn on PMOS transistor 61 and NMOS transistor 62, raising node N60 to the VPP potential (12 V) of the XP signal, and this VPP potential (12 V) is transmitted through transmission gate 66 to the word line WL. Since selection signal SEL is high (VCC), the source-drain voltage $V_{sd}$63 of NMOS transistor 63 is VPP−VCC.

In a write operation, the write control signal PG is high and the sector erase signal ER, block erase signal BER, and chip erase signal CER are low. VPP is 1.6 V, VNN is −9 V, and since PG is high, VXP is equal to VNN (−9 V).

In the word-line controller 80, the output of NOR gate 81 is low, so transmission gate 66 is switched on and transmission gate 67 is switched off in each row decoder 60B, connecting the word line WL to node N60.

The low-order address signals $AX_0$–$AX_4$ select one of the A-group pre-decoders 40$_0$–40$_{31}$. The operating potential signal XP at node N40 of the selected A-group pre-decoder 40 goes to the VXP level, thus to the VNN level of −9 V (the writing potential). The output signals of the non-selected A-group pre-decoders 40 remain at the ground level.

Similarly, the high-order address signals $AX_5$–$AX_9$ select one of the B-group pre-decoders 50$B_0$–50$B_{31}$. In the selected B-group pre-decoder 50B, selection signal BS is at the VPP potential (1.6 V) and the complementary selection signal nBS is at the VNN potential (−9 V). In the non-selected B-group pre-decoders, selection signal BS is at the VNN potential and the complementary selection signal nBS is at the VPP potential. In all cases, selection signal SEL is low.

In the row decoder 60B selected by the address signals $AX_0$–$AX_9$, PMOS transistor 61 and NMOS transistor 62 are switched on by the selection signals BS and nBS from the connected B-group pre-decoder, while NMOS transistor 63 is switched off. The word line WL is driven to the XP potential of VNN (−9 V, the writing potential) through nodes N40 and N60 and transmission gate 66.

In the non-selected row decoders 60B, the word line WL is held at the ground level by either the XP signal or the SEL signal.

Sector erase, block erase, chip erase, and write operations in the third embodiment are thus carried out in essentially the same way as in the second embodiment, but read operations are carried out using the reading potential signals XPR output from the C-group pre-decoders 70 instead of the operating potential signals XP output from the A-group pre-decoders, and using the read selection signals BSR output from the B-group pre-decoders instead of the BS and nBS selection signals. Consequently, read operations make no use of level shifters and no use of the VPP potential; this enables read operations to be carried out more quickly than in the preceding embodiments.

During block erase and chip erase operations, the source-drain voltage $V_{sd}$63 of NMOS transistor 63 in the selected row decoders is reduced to VPP−VCC, instead of the conventional VPP. The source-drain voltage $V_{sd}$67 of the NMOS transistor 67*b* and PMOS transistor 67*a* in transmission gate 67 is also VPP−VCC. The block erase and chip erase operations can therefore be carried out at high temperatures without excessive leakage of current to ground through these transistors 63, 67*a*, 67*b*.

Figure 11:
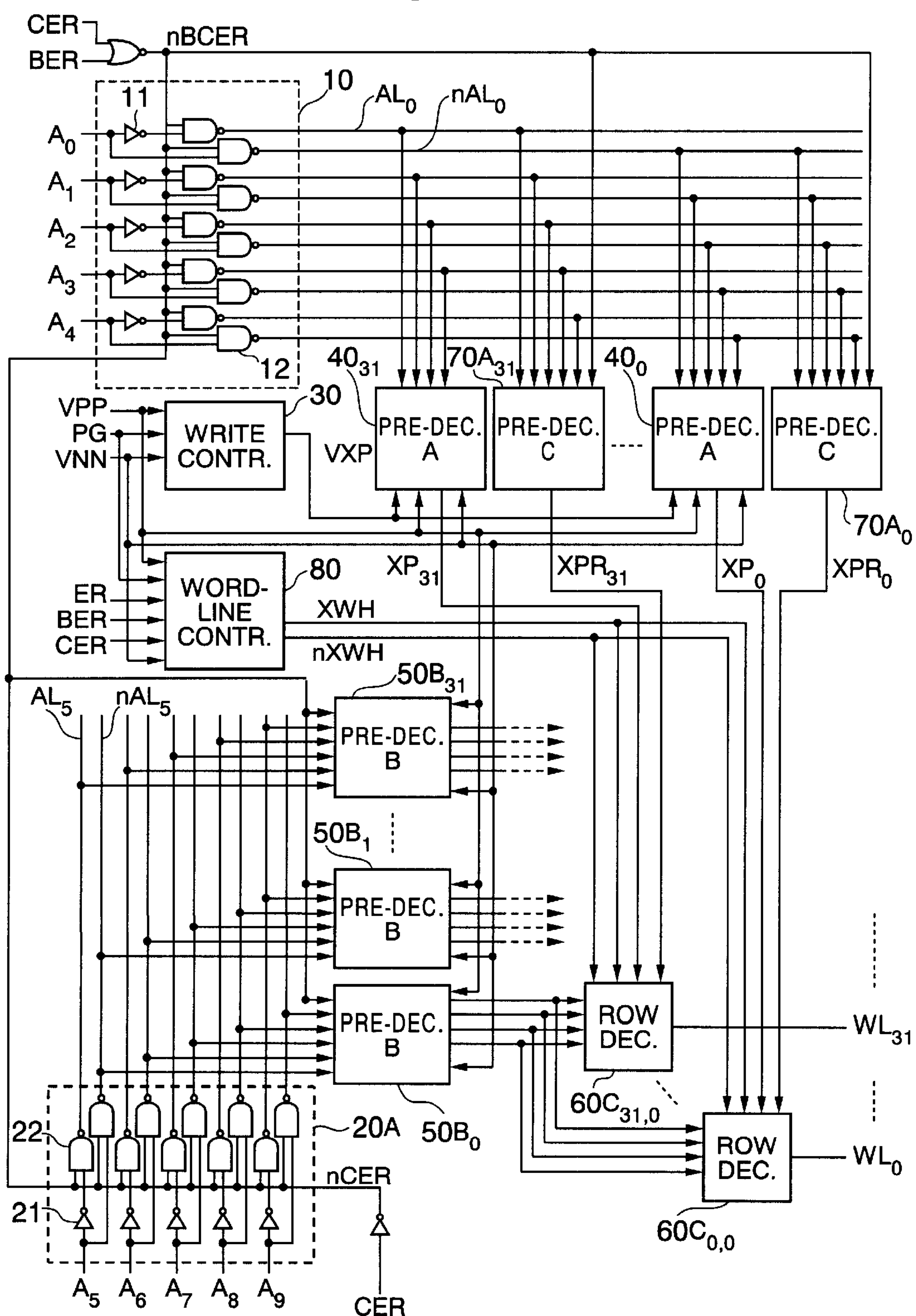
FIG. 11 is a block diagram of a word-line driving circuit according to a fourth embodiment of the invention.

Referring to FIG. 11, the fourth embodiment replaces the row decoders and C-group pre-decoders of the third embodiment with row decoders 60$C_{0,0}$, 60$C_{1,0}$, . . . and C-group pre-decoders 70$A_0$ to 70$A_{31}$ having a different structure.

Figure 12:
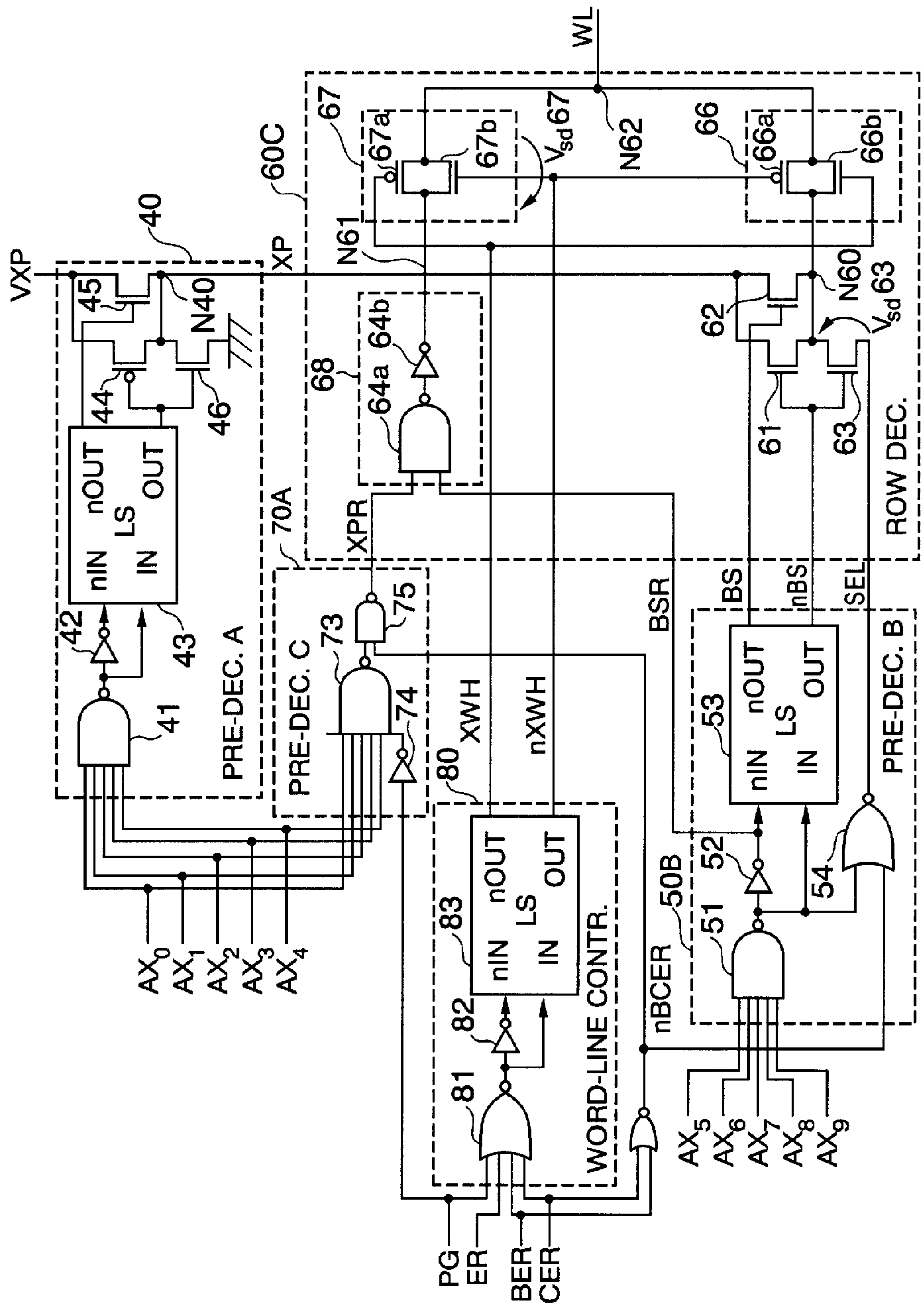
FIG. 12 is a block diagram showing further details of circuit blocks in FIG. 11.

FIG. 12 shows a the internal structure of a row decoder 60C, its connected pre-decoders 40, 50B, 70A, and the word-line controller 80 in the third embodiment.

The C-group pre-decoder 70A comprises a six-input NAND gate 73, an inverter 74, and a two-input NAND gate 75. Inverter 74 inverts the write control signal PG. NAND gate 73 receives the inverted write control signal PG output from the inverter 74 and the low-order address signals $AX_0$–$AX_4$. NAND gate 75 receives the output of NAND gate 73 and the inverted block/chip erase signal nBCER, and generates the reading potential signal XPR.

The row decoder 60C comprises a PMOS transistor 61, NMOS transistors 62, 63, transmission gates 66, 67, and nodes N60, N61, N62 as described in the third embodiment, and an AND gate 68 including a two-input NAND gate 68*a* and an inverter 68*b*. NAND gate 68*b* receives the reading potential signal XPR output from the C-group decoder 70A, and the read selection signal BSR output from the B-group pre-decoder 50B. The output of NAND gate 68*a* is inverted by inverter 68*b*, and supplied to node N61.

The other elements in FIG. 12 are identical to the corresponding elements in the third embodiment (FIG. 10).

The operation of the third embodiment is summarized in Table 5.

TABLE 5

Signal potentials in the fourth embodiment

| | | Mode | | | |
|---|---|---|---|---|---|
| Signal | Read | Sector erase | Block erase | Chip erase | Write |
| VPP | VCC | 12 V | 12 V | 12 V | 1.6 V |
| VNN | 0 V | 0 V | 0 V | 0 V | –9 V |
| PG | 0 V | 0 V | 0 V | 0 V | VCC |
| ER | 0 V | VCC | 0 V | 0 V | 0 V |
| BER | 0 V | 0 V | VCC | 0 V | 0 V |
| CER | 0 V | 0 V | 0 V | VCC | 0 V |
| nBCER | VCC | VCC | 0 V | 0 V | VCC |
| VXP | = VPP | = VPP | VPP | = VPP | = VNN |
| XP | VCC | 12 V | 12 V | 12 V | –9 V |
| (XP) | 0 V | 0 V | — | — | 0 V |
| XPR | VCC | VCC | VCC | VCC | 0 V |
| (XPR) | 0 V | 0 V | — | — | 0 V |
| BS | VCC | 12 V | 12 V | 12 V | 1.6 V |
| nBS | 0 V | 0 V | 0 V | 0 V | –9 V |
| SEL | 0 V | 0 V | VCC | VCC | 0 V |
| BSR | VCC | VCC | VCC | VCC | VCC |
| (BS) | 0 V | 0 V | 0 V | — | –9 V |
| (nBS) | VCC | 12 V | 12 V | — | 1.6 V |
| (SEL) | 0 V | 0 V | 0 V | 0 V | 0 V |
| (BSR) | 0 V | 0 V | 0 V | 0 V | 0 V |
| WL | VCC | 12 V | 12 V | 12 V | –9 V |
| (WL) | 0 V | 0 V | 0 V | — | 0 V |
| $V_{sd}$63 | VCC | 12 V | 12 V-VCC | 12 V-VCC | –9 V |
| $V_{sd}$67 | 0 V | 12 V-VCC | 12 V-VCC | 12 V-VCC | –9 V |
| ($V_{sd}$G3) | 0 V | 0 V | 0 V | — | 0 V |
| ($V_{sd}$67) | 0 V | 0 V | 0 V | — | 0 V |

In a read operation, the write control signal PG, sector erase signal ER, block erase control signal BER, and chip erase signal CER are all low, VPP is the power-supply potential VCC (3.3 V, for example), VNN is the ground potential (0 V), and VXP is equal to VPP (VCC).

As in the third embodiment, the output of NOR gate 81 in the word-line controller 80 is high, and in each row decoder 60C, transmission gate 66 is switched off and transmission gate 67 is switched on, connecting word line WL to node N61.

The low-order address signals $AX_0$–$AX_4$ select one of the C-group pre-decoders 70$A_0$–70$A_{31}$. In the selected C-group pre-decoder 70A, since the write control signal PG is low, the output of inverter 74 is high, so the output of NAND gate 73 is low and the reading potential signal XPR output by NAND gate 75 is high. In the non-selected C-group pre-decoders 70A, the output of NAND gate 73 is high, and since the inverted block/chip erase signal nBCER is also high, the reading potential signal XPR is low.

Similarly, the high-order address signals $AX_5$–$AX_9$ select one of the B-group pre-decoders 50$B_0$–50$B_{31}$. The read selection signal BSR output from the selected B-group pre-decoder 50B goes high, while the BSR output signals of the non-selected B-group pre-decoders 50B remain low.

In the row decoder 60C selected by the address signals $AX_0$–$AX_9$, the XPR and BSR signals received by the AND gate 68 are both high, so the AND gate 68 drives node N61 to the high logic level, which is the power-supply level VCC. In the non-selected row decoders, either XPR or BSR, or both, is low, so node N61 is held at the low (ground) level. Accordingly, as in the third embodiment, the word line WL connected to the selected row decoder 60C is driven to the VCC level (the reading potential), while the other word lines remain at the ground level.

In the sector, block, and chip erase operations and write operations, since one of the signals PG, ER, BER, and CER is high, the output of NOR gate 81 in the word-line controller 80 is low, and the operating mode signal XWH is at the VPP potential while the complementary operating mode signal nXWH is at the VNN potential. In each row decoder, transmission gate 66 is switched on and transmission gate 67 is switched off, connecting the word line WL to node N60.

Sector, block, and chip erase operations in the fourth embodiment are performed in the same way as in the third embodiment. In block erase and chip erase operations, as in the third embodiment, the source-drain voltage $V_{sd}$63 of NMOS transistor 63 and the source-drain voltage $V_{sd}$67 of the transistors in transmission gate 67 is reduced from VPP to VPP–VCC, enabling these operations to be carried out under high temperature conditions without excessive leakage of current to ground.

During write operations, there is a slight difference between the third and fourth embodiments in that the reading potential signal XPR is always low in the fourth embodiment, regardless of whether the C-group pre-decoder 70A is selected or not. Current consumption is therefore reduced, because the XPR signals are not switched between the high and low states as different C-group decoders 70A are selected. Throughout the write mode, the output of NAND gate 73 remains high and the output of NAND gate 75 remains low.

The preceding embodiments can be modified in various ways. For example, there may be arbitrary numbers of address signals and word lines, instead of the ten address signals ($A_0$–$A_9$) and 1024 word lines described above. The size of the blocks erased in block erase operations may differ from the size (128 word lines) described above. The VCC, VPP, and VNN potentials may have values different from those given above.

The internal structure of the pre-decoder circuits may be modified in various ways. For example, the XPR signal used in the third embodiment may be obtained from inverter 42 in the A-group pre-decoders, eliminating the need for the C-group pre-decoders.

The three-input AND gate 64 of the third embodiment may be replaced with the two-input AND gate 68 of the fourth embodiment, which takes the logical AND of the XPR and BSR signals. The source-drain voltage of the transistors in transmission gate 67 in the selected row decoder then becomes VCC+9 V, but since this comparatively large source-drain voltage occurs in only one row decoder, the resulting amount of current leakage remains negligible.

Since the VPP potential is not used during read operations in the third and fourth embodiments, VPP need not be set to the power-supply potential VCC, but can be left at another potential.

Those skilled in the art will recognize that further variations are possible within the scope claimed below.

What is claimed is:

1. A method of driving word lines in a non-volatile semiconductor memory having a plurality of memory cells coupled to the word lines, the method including driving the word lines selectively to different potentials to read and write data in the coupled memory cells, the method also comprising:

driving a plurality of the word lines simultaneously to an erasing potential to erase the data in the memory cells coupled to said plurality of word lines;

supplying a ground potential to the word lines through respective switching elements;

switching the respective switching elements off when the word lines are driven to read, write, and erase the data in the coupled memory cells; and supplying a mitigating potential, intermediate between the ground potential and the erasing potential, to the respective switching elements that are switched off when said plurality of word lines are simultaneously driven to the erasing potential.

2. The method of claim 1, wherein driving the plurality of the word lines simultaneously to the erasing potential comprises driving all of the word lines in the non-volatile semiconductor memory simultaneously to the erasing potential.

3. The method of claim 2, wherein supplying the mitigating potential comprises supplying a chip erase signal to the respective switching elements.

4. The method of claim 3, wherein supplying the ground potential also comprises supplying the chip erase signal to the respective switching elements.

5. The method of claim 1, wherein driving the plurality of the word lines simultaneously to the erasing potential comprises:

selecting a block of the word lines according to an address signal; and driving the word lines in the selected block to the erasing potential.

6. The method of claim 5, wherein supplying the mitigating potential comprises:

performing a logic operation on at least the address signal and a block erase signal to generate a selection signal; and supplying the selection signal to the respective switching elements.

7. The method of claim 6, wherein supplying the ground potential also comprises supplying the selection signal to the respective switching elements.

8. The method of claim 1, further comprising:

generating the erasing potential by level-shifting a write control signal;

generating a reading potential by logic operations without level shifting; and driving the word lines to the reading potential to read the data stored in the coupled memory cells.

9. A word-line driving circuit for a non-volatile semiconductor memory having a plurality of word lines and a plurality of memory cells coupled to the word lines, the non-volatile semiconductor memory being operable in a write mode to store data in the memory cells, a read mode to read the stored data, and a first erase mode to simultaneously erase the data stored in the memory cells coupled to at least two of the word lines, the word-line driving circuit comprising:

a plurality of first switching elements coupled to respective word lines;

a plurality of second switching elements coupled to respective word lines;

first means for switching the first switching elements and the second switching elements on and off;

second means for supplying the first switching elements with different potentials for driving the word lines, the different potentials including at least an erasing potential supplied in the first erase mode; and third means for supplying the second switching elements with a ground potential in the write mode and the read mode, and with a mitigating potential in the first erase mode, the mitigating potential being intermediate between the ground potential and the erasing potential.

10. The word-line driving circuit of claim 9, wherein, in the first erase mode, the first means switches on all of the first switching elements and switches off all of the second switching elements, thereby driving all of the word lines to the erasing potential.

11. The word-line driving circuit of claim 10, wherein the third means supplies a chip erase signal to the second switching elements.

12. The word-line driving circuit of claim 10, the non-volatile semiconductor memory also being operable in a second erase mode to erase the data in the memory cells coupled to a selectable block of the word lines, wherein, in the second erase mode, the third means supplies the mitigating potential to the second switching elements coupled to the word lines in the selectable block.

13. The word-line driving circuit of claim 12, wherein the third means comprises:

a first logic circuit receiving a chip erase signal and a block erase signal and generating a combined erase signal; and a plurality of second logic circuits providing the combined erase signal to the second switching elements under control of the first means.

14. A word-line driving circuit for a non-volatile semiconductor memory, the non-volatile semiconductor memory having a plurality of word lines and a plurality of memory cells coupled to the word lines, receiving first address signals and second address signals for selecting the word lines, and being operable in a write mode to store data in the memory cells, a read mode to read the stored data, and a first erase mode to simultaneously erase the stored data from the memory cells coupled to at least two of the word lines, the word-line driving circuit comprising:

a plurality of first pre-decoders for decoding the first address signals, and supplying a writing potential in the write mode and an erasing potential in the first erase mode, responsive to the decoded first address signals;

a plurality of second pre-decoders for decoding the second address signals and generating respective first selection signals;

a plurality of third pre-decoders for decoding the first address signals generating respective second selection signals;

a mitigating circuit for generating a third selection signal having a ground potential in the write mode and the read mode, and a mitigating potential intermediate between the ground potential and the erasing potential in the first erase mode; and a controller for generating a mode signal distinguishing the read mode from the write mode and the first erase mode;

the word-line driving circuit also comprising, for each word line among the plurality of word lines, a first output means having a first node, a first switching element, and a second switching element, the first switching element and the second switching element being switched on and off by one of the first selection signals, the first switching element supplying the writing potential and the erasing potential from one of the first pre-decoders to the first node when switched on, the second switching element supplying the output signal from the mitigating circuit to the first node when switched on;

a second output means having a second node, for supplying a reading potential to the second node responsive to one of the first selection signals and one of the second selection signals; and switching means for coupling said word line to said first node when the mode signal indicates the write mode or the first erase mode, and coupling said word line to the second node when the mode signal indicates the read mode.

15. The word-line driving circuit of claim 14, wherein, in the first erase mode, the first decoders switch on all of the first switching elements, thereby driving all of the word lines to the erasing potential.

16. The word-line driving circuit of claim 15, wherein the third selection signal is a chip erase signal.

17. The word-line driving circuit of claim 15, the non-volatile semiconductor memory also being operable in a second erase mode to erase the stored data from the memory cells coupled to a selectable block of the word lines, wherein the mitigating circuit comprises:

a first logic circuit receiving a chip erase signal and a block erase signal and generating a combined erase signal; and a plurality of second logic circuits generating the third selection signal for respective second switching elements from the combined erase signal under control of the second decoders.

* * * * *